US012670942B1

(12) United States Patent
Kolar et al.

(10) Patent No.: US 12,670,942 B1
(45) Date of Patent: Jun. 30, 2026

(54) PLATE-LINE ASSIST MEMORY

(71) Applicant: Kepler Computing Inc., San Francisco, CA (US)

(72) Inventors: Pramod Kolar, Cary, NC (US); Rajeev Kumar Dokania, Beaverton, OR (US); Mustansir Yunus Mukadam, Seattle, WA (US); Darshak Doshi, Sunnyvale, CA (US); Biswajeet Guha, Hillsboro, OR (US); Tanay Gosavi, Portland, OR (US); Amrita Mathuriya, Portland, OR (US); Debo Olaosebikan, San Francisco, CA (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 67 days.

(21) Appl. No.: 18/470,362

(22) Filed: Sep. 19, 2023

(51) Int. Cl.
*G11C 11/22* (2006.01)

(52) U.S. Cl.
CPC ........ *G11C 11/2253* (2013.01); *G11C 11/221* (2013.01)

(58) Field of Classification Search
CPC .. G11C 11/2253; G11C 11/221; G11C 11/223
See application file for complete search history.

(56) References Cited

U.S. PATENT DOCUMENTS

| | | | |
|---|---|---|---|
| 2003/0214830 A1* | 11/2003 | Rickes | G11C 11/22 |
| | | | 365/145 |
| 2004/0027873 A1* | 2/2004 | Nishihara | H10B 53/00 |
| | | | 257/E27.104 |
| 2019/0027202 A1* | 1/2019 | Bedeschi | G11C 11/2257 |

* cited by examiner

*Primary Examiner* — Han Yang
(74) *Attorney, Agent, or Firm* — MUGHAL GAUDRY & FRANKLIN PC

(57) ABSTRACT

Described herein is a method and apparatus to reduce electric displacement and polarization target for a memory bit-cell. In at least one embodiment, the apparatus comprises one or more circuitries to adjust voltage on a plate-line to be above or below a nominal voltage of the plate-line based on a write operation or read operation on a bit-cell. In at least one embodiment, the bit-cell comprises a transistor and a capacitor including non-linear polar material, wherein the capacitor has a first terminal coupled to the plate-line and a second terminal coupled to the transistor.

19 Claims, 25 Drawing Sheets

1000

Figure 5A:
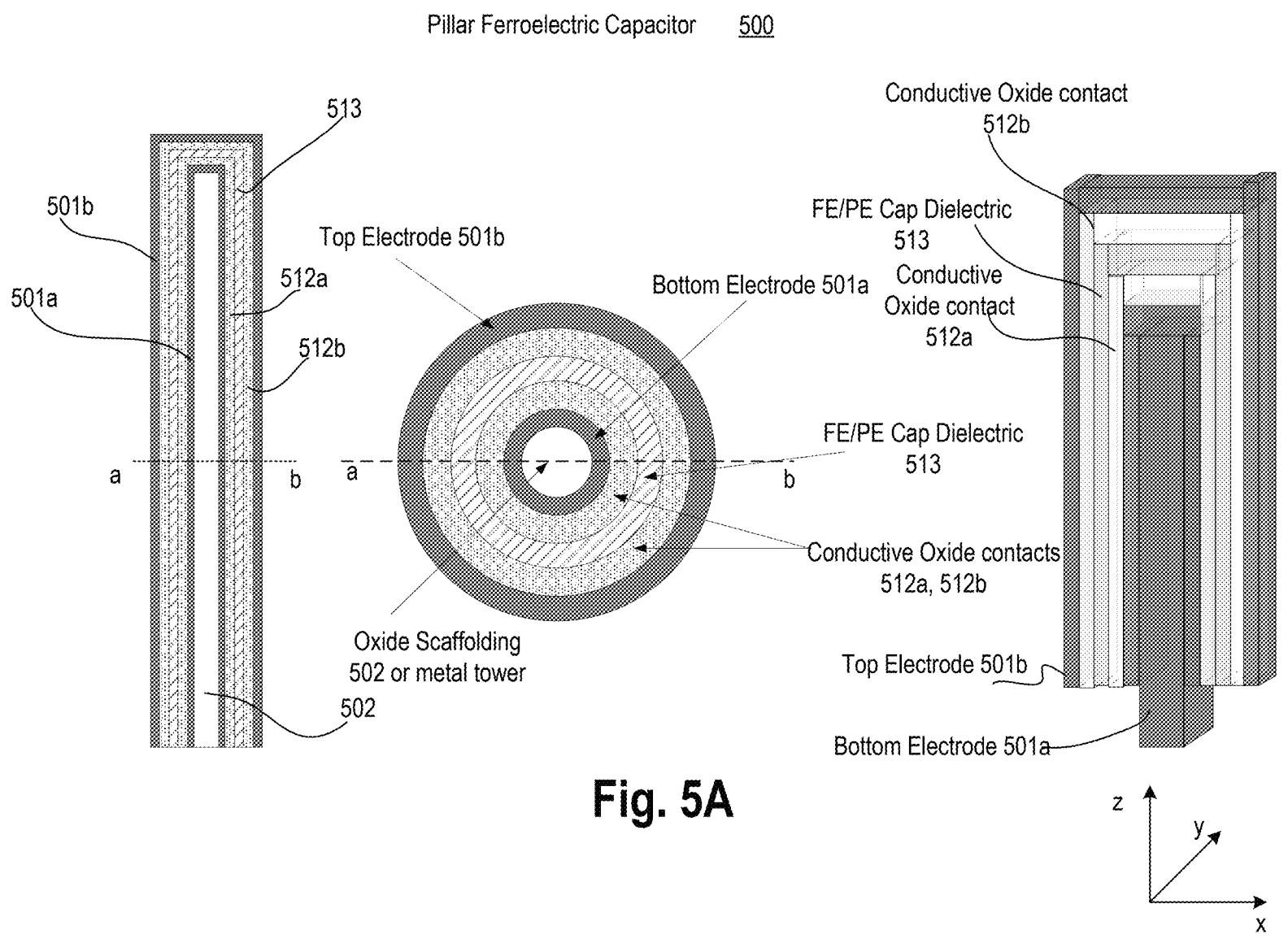

Pillar Ferroelectric Capacitor     500

Conductive Oxide contact
512b

FE/PE Cap Dielectric
513

Conductive
Oxide contact
512a

Bottom Electrode 501a b

FE/PE Cap Dielectric
513

Conductive Oxide contacts
512a, 512b

Top Electrode 501b

Bottom Electrode 501a

Top Electrode 501b

Oxide Scaffolding
502 or metal tower
502

703 — Sense-Amp, BL Driver, PL drvier

PL0 BL0 PL1 BL1 PLN BLN $701_{0,N}$ $701_{M,N}$

WLM

701

$701_{0,0}$ $701_{M,0}$

WL1

WL0

WL driver, WL repeaters

704

Address Decoder (Row Select logic)

702

Wear-leveling logic (Refresh logic) 706

1000

1200

1300

1420

1500

PLATE-LINE ASSIST MEMORY

BACKGROUND

Memory bit-cells are arranged in rows and columns that form segments, arrays, or banks. To access a bit-cell in a bank or array, a word-line is asserted to select a row or column in the bank or array where the bit-cell resides. To program a bit-cell having a capacitor, a voltage is developed across it after word-line is activated (e.g., asserted or de-asserted depending on conductivity type of access transistor of the bit-cell). As supply voltage or operating voltage is being lowered for low power applications, effective voltage across the capacitor during write operation is also lowered. Lower voltage across the capacitor to program it may not result in reliable programming. This presents a challenge in programming a bit-cell capacitor.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5A illustrates a non-planar ferroelectric or paraelectric capacitor structure, in accordance with at least one embodiment.

DETAILED DESCRIPTION

Figure 1:
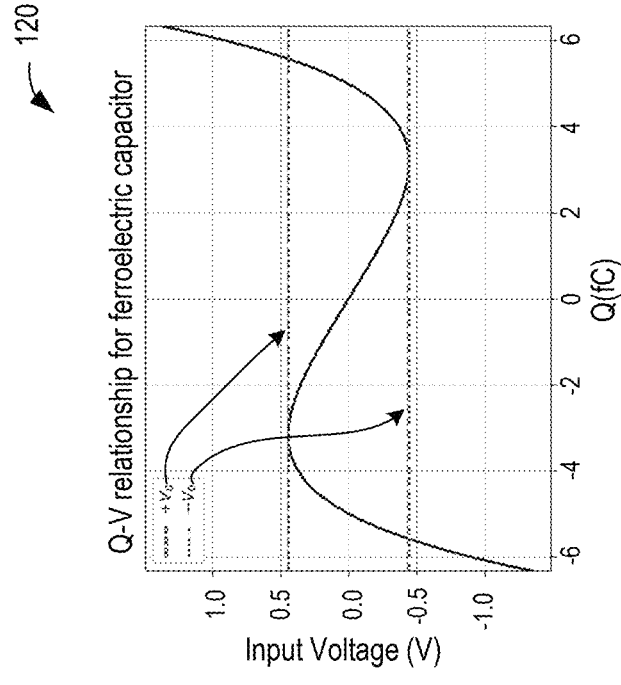
FIG. 1 illustrates a set of plots that show the behavior of a ferroelectric capacitor, a paraelectric capacitor, and a linear capacitor.
Figure 1:
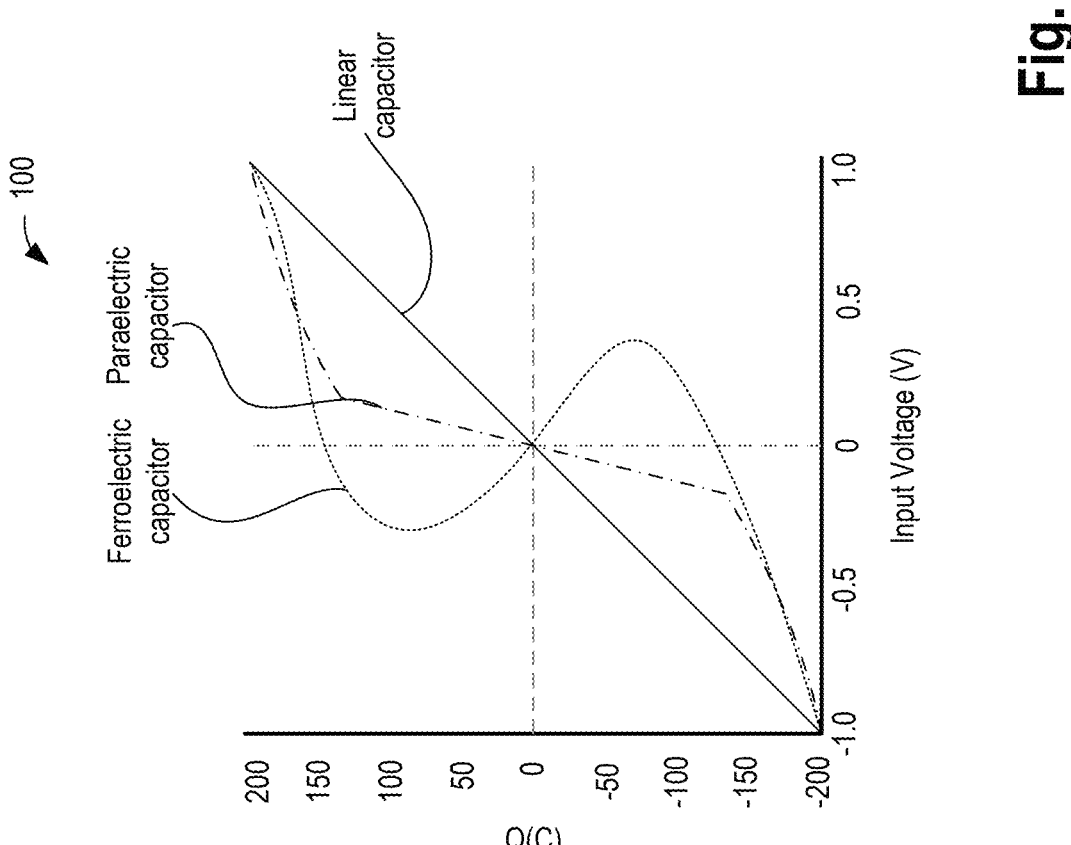

Storage endurance in a capacitor comprising non-linear polar material such as ferroelectric material, paraelectric material, or non-linear dielectric depends on several factors including electric displacement and polarization (dp). More reliable switching of states in a capacitor can be achieved when variation in dp is reduced, in accordance with at least one embodiment. In at least one embodiment, one or more circuitries are provided that allow for fully saturated dp in a capacitor of a one-transistor one-capacitor (1T1C) bit-cell. In at least one embodiment, 1T1C bit-cell includes a transistor having a gate terminal coupled to a word-line (WL), a drain terminal coupled to a bit-line (BL), and a source terminal coupled to a capacitor. In at least one embodiment, a plate-line (PL) is coupled to capacitor. In at least one embodiment, one or more circuitries adjust a voltage on plate-line to be above or below a nominal voltage on plate-line based on a read operation or a write operation. In at least one embodiment, nominal voltage is a nominal supply voltage (e.g., when bit-cell is being written a logic 1 value). In at least one embodiment, nominal voltage is a ground voltage (e.g., when bit-cell is being read or a written logic 0 value). In at least one embodiment, nominal voltage is a ground voltage (e.g., when bit-cell is being written a logic 1 value). In at least one embodiment, nominal voltage is a nominal supply voltage (e.g., when bit-cell is being read or a written logic 0 value).

Here, "nominal supply voltage" generally refers to a supply voltage that is specified by a process technology node as being reliable for a transistor. In at least one embodiment, a transistor operating on a nominal supply voltage may not observe oxide breakdown and/or electromigration effects for a specified period.

In at least one embodiment, plate-line coupled to capacitor of bit-cell is boosted to a negative voltage (e.g., $-V$) relative to a nominal voltage during a write 1 operation when plate-line (PL) is parallel to bit-line (BL). In at least one embodiment, when voltage on PL is boosted to negative voltage, voltage drop across a capacitor (e.g., capacitor with non-linear polar material) is nominal supply voltage VDD (e.g., when negative voltage $-V$ is equal to a threshold voltage of transistor of bit-cell). In at least one embodiment, PL is parallel to WL, and voltage on PL is boosted according to scheme described with reference to a memory where PL is parallel to BL.

In at least one embodiment, during read operation, voltage on PL can be boosted by V over nominal supply voltage VDD (e.g., voltage on PL is boosted to VDD+V) to have larger signal on BL for more reliable read. In at least one embodiment, when a capacitor is being written to, access transistor associated or coupled to capacitor is driven by a word-line at higher voltage than nominal supply voltage VDD. In at least one embodiment, voltage on WL and PL are boosted (e.g., voltage on WL is boosted to VDD+V and voltage on PL is boosted to ground-V) during write 1 operation to provide greater margin for process variability in non-linear polar material of capacitor of bit-cell. In at least one embodiment, voltage on WL and PL are boosted (e.g., voltage on WL is boosted to VDD+V and voltage on PL is boosted to VDD+V) during read operation (or write 0 operation) to provide greater margin for process variability in non-linear polar material of capacitor of bit-cell.

In at least one embodiment, a flying capacitor provides boosted positive or negative voltage on PL. In at least one embodiment, a voltage source (e.g., a positive or negative voltage source) is provided to boost voltage on PL positively or negatively. In at least one embodiment, an external voltage source (e.g., external to memory or processor die) is provided to boost voltage on PL positively or negatively. In at least one embodiment, to improve memory array efficiency, the cost of flying capacitor can be amortized over multiple PLs in a memory array. In at least one embodiment, the same flying capacitor is used for positive and negative boost generation on PL to reduce area overhead. In at least one embodiment, flying capacitor may also be used to generate positive or boosted voltage on WL.

In at least one embodiment, when PL is parallel to WL, write operations may include two phases—a first phase and a second phase. In at least one embodiment, first phase is a write 0 operation followed by second phase, which is a write 1 operation. In at least one embodiment, during write 1 operation, both PL and WL are boosted (e.g., PL is negatively boosted to ground-V while WL is positively boosted to VDD+V). In at least one embodiment, during write 0 operation, PL is positively boosted to VDD+V voltage. In at least one embodiment, during read operation, PL is boosted to VDD+V for better sensing margin on BL for sense amplifier (e.g., signal on BL becomes larger for easier sensing). In at least one embodiment, voltage across capacitor of bit-cell is VDD for both write 0 and write 1 operations when boosted voltage (e.g., VDD+V or ground-V) is equal to magnitude of threshold voltage of access transistor of bit-cell. In at least one embodiment, WL is positively boosted (e.g., VDD+V) in write 1 operation.

In at least one embodiment, logic 1 write operation and logic 0 write operation are timewise decoupled for bit-cells that share same word-line. In at least one embodiment, a write cycle comprises first phase for logic 0 write operation and a second phase for logic 1 write operation. In at least one embodiment, first phase occurs before second phase. In at least one embodiment, first phase occurs after second phase. In at least one embodiment, logic 0 write operation may not need word-line to be at nominal supply voltage plus threshold voltage of access transistor. In at least one embodiment, voltage on word-line for logic 0 write operation is at nominal supply voltage level.

In at least one embodiment, bit-cells in a row or column of a memory array that share same word-line are written logic 1 and logic 0 values in different phases. In at least one embodiment, bit-cells that are to be written 0 are identified and logic 0 is written to them in logic 0 write operation, where voltage on word-line is at nominal supply voltage level. In at least one embodiment, bit-cells that are to be written 1 are identified and logic 1 is written to them in logic 1 write operation, where voltage on word-line is higher than nominal supply voltage level. In at least one embodiment, logic 0 write operation phase occurs prior to logic 1 write operation phase. In at least one embodiment, logic 1 write operation phase occurs prior to logic 0 write operation phase.

In at least one embodiment, read operation comprises a read phase followed by a writeback phase and then a standby phase. In at least one embodiment, writeback phase comprises write operation as discussed herein to writeback same value that is read out. In at least one embodiment, writeback phase comprises logic 1 write operation phase since read phase is effectively like a logic 0 write operation phase since word-line operates at nominal supply voltage level.

In at least one embodiment, one or more circuitries are provided to adjust voltage on a plate-line of a bit-cell to be above or below a nominal voltage of the plate-line based at least in part on a write operation, write-back operation, or read operation on the bit-cell.

In at least one embodiment, electric displacement and polarization target for non-linear polar material based memory bit-cells is reduced by negatively boosting voltage on PL (e.g., by $-V$ from ground) or positive boosting voltage on PL by $+V$ from VDD depending on Write 1 or Write 0 (or read) operations of the memory. Here, an electric displacement and polarization target refers to quantity level that defines stable storage of data in a capacitor comprising non-linear polar material. A lower electric displacement and polarization target means ease in reliably writing and storing data in a capacitor with non-linear polar material. A higher electric displacement and polarization target means difficulty in reliably writing and storing data in a capacitor with non-linear polar material.

In at least one embodiment, a capacitor in a bit-cell is replaced with a memory element. In at least one embodiment, a memory element is one of a magnetic tunneling junction (MTJ), resistive device, phase-change device, etc. In at least one embodiment, a capacitor of a bit-cell comprises a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table.

Here, numerous details are discussed to provide a more thorough explanation of at least one embodiment. It will be apparent, however, to one skilled in art, that at least one embodiment may be practiced without these specific details. In other instances, well-known structures and devices are shown in block diagram form, rather than in detail, to avoid obscuring at least one embodiment.

Note that in corresponding drawings of at least one embodiment, signals are represented with lines. Some lines may be thicker, to indicate more constituent signal paths, and/or have arrows at one or more ends, to indicate primary information flow direction. Such indications are not intended to be limiting. Rather, lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of figures having same reference numbers (or names) as elements of any other figure can operate or function in any manner like that described but are not limited to such.

FIG. 1 illustrates a set of plots showing behavior of a ferroelectric capacitor, a ferroelectric capacitor, and a linear capacitor, in accordance with at least one embodiment. Plot 100 compares transfer function for a linear capacitor, a ferroelectric (PE) capacitor (a nonlinear capacitor) and a ferroelectric (FE) capacitor (a nonlinear capacitor). Here, x-axis is input voltage or voltage across a capacitor, while y-axis is charge on a capacitor. In at least one embodiment, ferroelectric (FE) material can be any suitable low voltage FE material that allows FE material to switch its state by a low voltage (e.g., 100 mV). In at least one embodiment, threshold in FE material has a highly nonlinear transfer function in polarization versus voltage response. In at least one embodiment, threshold is related to: a) nonlinearity of switching transfer function; and b) squareness of FE switching. In at least one embodiment, nonlinearity of switching transfer function is width of derivative of polarization versus voltage plot. In at least one embodiment, squareness is defined by a ratio of remnant polarization to saturation polarization, where perfect squareness will show a value of 1. In at least one embodiment, squareness of FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a nonlinear dielectric. In at least one embodiment, squareness of FE switching can also be changed by granularity of an FE layer. In at least one embodiment, a perfectly epitaxial, single crystalline FE layer may show higher squareness (e.g., ratio is closer to 1) compared to a polycrystalline FE. In at least one embodiment, perfect epitaxial can be accomplished using lattice matched bottom and top electrodes. In at least one embodiment, BiFeO (BFO) can be epitaxially synthesized using a lattice matched $SrRuO_3$ bottom electrode yielding P-E loops that are square. In at least one embodiment, progressive doping with La may reduce squareness.

Plot 120 shows charge and voltage relationship for a ferroelectric capacitor, in accordance with at least one embodiment. In at least one embodiment, a capacitor with ferroelectric material is a nonlinear capacitor with its potential $V_F(Q_F)$ as a cubic function of its charge. Plot 120 illustrates characteristics of an FE material, in accordance with at least one embodiment. Plot 120 is a charge-voltage (Q-V) plot for a block of $Pb(Zr_{0.5}Ti_{0.5})O_3$ of area $(100 \text{ nm})^2$ and thickness 30 nm (nanometer), in accordance with at least one embodiment. Plot 120 shows local extrema at $+/-V_o$ indicated by dashed lines. Here, $V_c$ is coercive voltage. In applying a potential V across an FE material, its charge can be unambiguously determined for $|V|>V_o$. Otherwise, charge of an FE material is subject to hysteresis effects.

In at least one embodiment, FE material comprises a perovskite of type $ABO_3$, where 'A' and 'B' are two cations of different sizes, and 'O' is oxygen which is an anion that bonds to both cations. Generally, size of A atoms is larger than size of B atoms. In at least one embodiment, FE material can be replaced with a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table. In at least one embodiment, non-linear polar material includes perovskite that can be doped (e.g., by La or lanthanides). In least one embodiment, non-linear polar material includes lead zirconium titanate (PZT) or PZT with a second doping material, wherein the second doping material is one of La or Nb. In least one embodiment, non-linear polar material includes bismuth ferrite (BFO) with a first doping material, wherein the first doping material is one of lanthanum, one or more elements from lanthanide series of a periodic table, or one or more elements of a 3d, 4d, 5d, 6d, 4f, and 5f series of periodic table.

In at least one embodiment, non-linear polar material includes a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST). In at least one embodiment, non-linear polar material includes a hexagonal ferroelectric, which includes one of: $YMnO_3$ or $LuFeO_3$. In at least one embodiment, non-linear polar material includes hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides.

In at least one embodiment, non-linear polar material includes hafnium oxide of a form $Hf_{1-x}E_xO_z$ wherein 'x' denotes a fraction, and E includes one of Al, Ca, Ce, Dy, Er, Gd, Ge, La, Sc, Si, Sr, Sn, Zr, or Y. In at least one embodiment, non-linear polar material includes $HfO_2$ doped with Ey, where E includes one of Al, Ca, Ce, Dy, Er, Gd, Ge, La, Sc, Si, Sr, Sn, or Y, and wherein 'y' is a fraction. In at least one embodiment, non-linear polar material includes Al(1-x)Sc(x)N, Ga(1-x)Sc(x)N, Al(1-x)Y(x)N or Al(a)Mg (b)Nb(c)N, wherein a, b, and c are respective compositional fractions. In at least one embodiment, non-linear polar material includes niobate type compounds including $LiNbO_3$, $LiTaO_3$, $LiTaO_2F_2$, $Sr_xBa1-xNb_2O_6$ where $0.32 \le x \le 0.8$, or $KSr_2Nb_5O_{15}$. In at least one embodiment, non-linear polar material includes an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100. In at least one embodiment, non-linear polar material includes a paraelectric material that comprises $SrTiO_3$, Ba(x)Sr(y)$TiO_3$, $HfZrO_2$, Hf—Si—O, or a PMN-PT based relaxor ferroelectric.

In at least one embodiment, FE material is perovskite, which includes one or more of: La, Sr, Co, Sr, Ru, Y, Ba, Cu, Bi, Ca, or Ni. In at least one embodiment, metallic perovskites such as $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, or $NaTaO_3$, etc. may be used as FE material. In at least one embodiment, perovskites can be suitably doped to achieve a spontaneous distortion in a range of 0.3% to 2%. In at least one embodiment, for chemically substituted lead titanate such as Zr in Ti site; and La or Nb in Ti site, concentration of these substitutes is such that it achieves spontaneous distortion in range of 0.3% to 2%. In at least one embodiment, for chemically substituted $BiFeO_3$, $BrCrO_3$, or $BuCoO_3$ class of materials, La or rare earth substitution into Bi site can tune spontaneous distortion. In at least one embodiment, FE material is contacted with a conductive metal oxide that includes one of conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In at least one embodiment, FE material comprises a stack of layers including low voltage FE material between conductive oxides. In at least one embodiment, when FE material is a perovskite, conductive oxides are of type AA'BB'$O_3$. A' is a dopant for atomic site A, it can be an element from lanthanides series. B' is a dopant for atomic site B, it can be an element from transition metal elements, such as Sc, Ti, V, Cr, Mn, Fe, Co, Ni, Cu, or Zn. In at least one embodiment, A' may have same valency of site A, with a different ferroelectric polarizability. In at least one embodiment, when metallic perovskite is used for FE material, conductive oxides can include one or more of: $IrO_2$, $RuO_2$, $PdO_2$, $OsO_2$, or $ReO_3$. In at least one embodiment, perovskite is doped with La or lanthanides. In at least one embodiment, thin layer (e.g., approximately 10 nm) perovskite template conductors such as $SrRuO_3$ coated on top of $IrO_2$, $RuO_2$, $PdO_2$, and $PtO_2$, which have a non-perovskite structure but higher conductivity to provide a seed or template for growth of pure perovskite ferroelectric at low temperatures, are used as conductive oxides. In at least one embodiment, conductive oxides include one or more of: Ir, In, Fe, Ru, Pd, Os, or Re.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. In at least one embodiment, room temperature paraelectric materials include: $SrTiO_3$, Ba(x)Sr(y)$TiO_3$ (where x may be, for example, −0.05 or 0.5, and y may be, for example, 0.95), $HfZrO_2$, Hf—Si—O, La-substituted $PbTiO_3$, or PMN-PT based relaxor ferroelectrics.

In at least one embodiment, FE material comprises one or more of: hafnium (Hf), zirconium (Zr), aluminum (Al), silicon (Si), their oxides, or their alloyed oxides. In at least one embodiment, FE material includes one or more of: Al(1-x)Sc(x)N, Ga(1-x)Sc(x)N, Al(1-x)Y(x)N or Al(1-x-y) Mg(x)Nb(y)N, y doped $HfO_2$, where x includes one of: Al, Ca, Ce, Dy, Er, Gd, Ge, La, Sc, Si, Sr, Sn, or Y, wherein 'x' or 'y' is a fraction. In at least one embodiment, FE material includes one or more of: bismuth ferrite (BFO), lead zirconate titanate (PZT), BFO with a first doping material, or PZT with a second doping material, wherein the first or second doping material is one of Nb or La; and relaxor ferroelectrics such as PMN-PT.

In at least one embodiment, FE material includes bismuth ferrite (BFO) with a first doping material wherein the first doping material is one of lanthanum, any element from lanthanide series of periodic table, or one or more elements of a 3d, 4d, 5d, 6d, 4f, and 5f series of periodic table. In at least one embodiment, FE material includes lead zirconium titanate (PZT) or PZT with a second doping material, wherein the second doping material is one of La or Nb. In at least one embodiment, FE material includes a relaxor ferroelectric including one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one embodiment, FE material includes hafnium oxides of a form, Hf(1-x)ExOy where E can be Al, Ca, Ce, Dy, Er, Gd, Ge, La, Sc, Si, Sr, Sn, or Y. In at least one embodiment, FE material includes niobate type compounds $LiNbO_3$, $LiTaO_3$, lithium iron tantalum oxy fluoride, barium strontium niobate, sodium barium niobate, or potassium strontium niobate.

In at least one embodiment, FE material comprises multiple layers. In at least one embodiment, alternating layers of [Bi2O2]2+, and pseudo-perovskite blocks ($Bi_4Ti_3O_{12}$ and related Aurivillius phases), with perovskite layers that are 'n' octahedral layers in thickness can be used. In at least one embodiment, FE material comprises organic material. In at least one embodiment, FE material comprises polyvinylidene fluoride or polyvinylidene difluoride (PVDF).

In at least one embodiment, FE material comprises hexagonal ferroelectrics of type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). In at least one embodiment, ferroelectric phase is characterized by a buckling of layered $MnO5$ polyhedra, accompanied by displacements of Y ions, which lead to a net electric polarization. In at least one embodiment, hexagonal FE includes one of: $YMnO_3$ or $LuFeO_3$. In at least one embodiment, when FE material comprises hexagonal ferroelectrics, conductive oxides are of $A_2O_3$ (e.g., $In_2O_3$, $Fe_2O_3$) and $ABO_3$ type, where 'A' is a rare earth element and B is Mn.

In at least one embodiment, FE material comprises improper FE material. An improper ferroelectric is a ferroelectric where primary order parameter is an order mechanism such as strain or buckling of atomic order. In at least one embodiment, improper FE materials are LuFeO3 class of materials or super lattice of ferroelectric and paraelectric materials PbTiO3 (PTO) and SnTiO3 (STO), respectively, and LaAlO3 (LAO) and STO, respectively. In at least one embodiment, the super lattice is [PTO/STO]n or [LAO/ STO]n, where 'n' is between 1 and 100. In at least one embodiment, paraelectric material includes one of: SrTiO3, Ba(x)Sr(y)TiO3 (where x may be, for example, –0.5, and y may be, for example, 0.95), BaTiO3, HfZrO2, Hf—Si—O, La-substituted PbTiO3, or PMN-PT based relaxor ferroelectrics.

Figure 2:
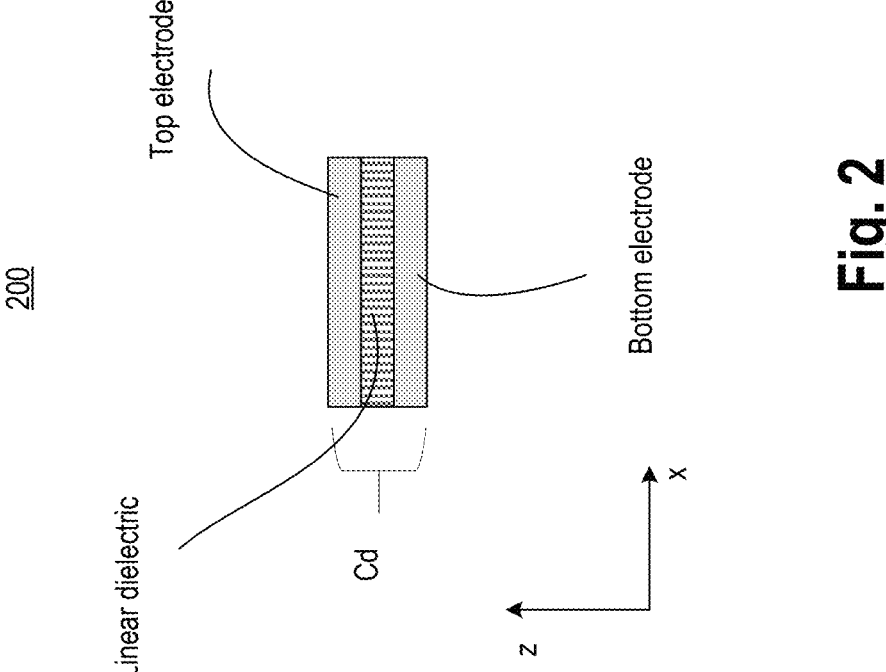
FIG. 2 illustrates a planar linear capacitor structure, in accordance with at least one embodiment.

FIG. 2 illustrates planar capacitor structure 200, in accordance with at least one embodiment. In at least one embodiment, capacitors for multi-input capacitive structures are linear capacitors. In at least one embodiment, capacitors can take any planar form. One such form is illustrated in FIG. 2, in accordance with at least one embodiment. In at least one embodiment, planar capacitor structure 200 is a metal-insulator-metal (MIM) capacitor comprising a bottom electrode, a top electrode, and a linear dielectric between top electrode and bottom electrode as shown. In at least one embodiment, conductive oxide layer(s) are formed between bottom electrode and linear dielectric. In at least one embodiment, conductive oxide layer(s) are formed between top electrode and linear dielectric. In at least one embodiment, conductive oxides include: $IrO_2$, $RuO_2$, $PdO_2$, $OSO_2$, or $ReO_3$. In at least one embodiment, conductive oxides are of form $A2O_3$ (e.g., $In2O_3$, $Fe2O_3$) and $ABO_3$ type, where 'A' is a rare earth element and 'B' is Mn.

In at least one embodiment, dielectric layer includes one or more of: SiO2, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

Figure 3A:
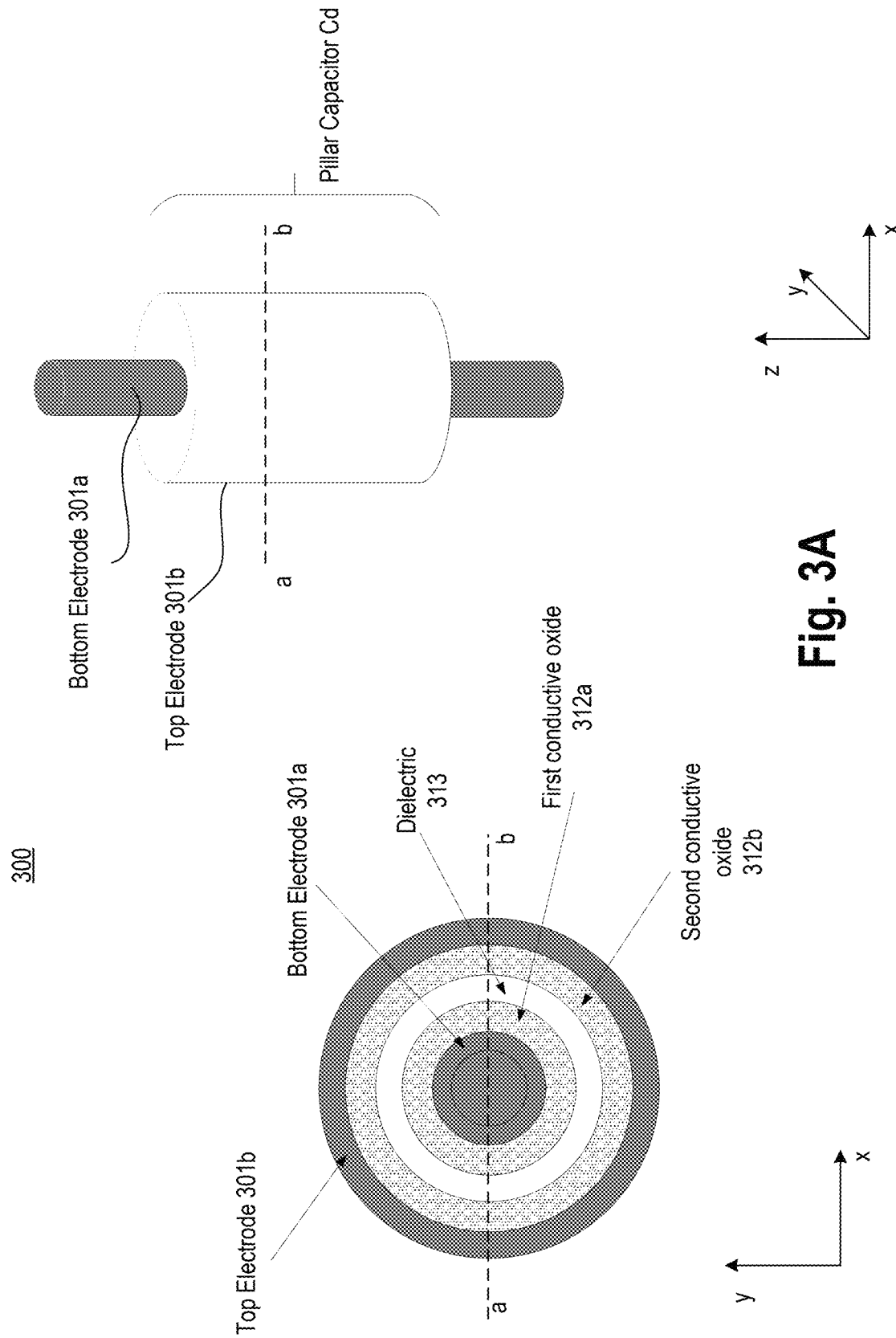
FIG. 3A illustrates a non-planar linear capacitor structure, in accordance with at least one embodiment.

FIG. 3A illustrates non-planar capacitor structure 300, in accordance with at least one embodiment. In at least one embodiment, non-planar capacitor structure 300 is rectangular in shape. Taking cylindrical shaped case, in at least one embodiment, layers of non-planar capacitor structure 300 from center going outwards include bottom electrode 301a, first conductive oxide 312a, dielectric material 313, second conductive oxide 312b, and top electrode 301b. A cross-sectional view along "ab" dashed line is illustrated in middle of FIG. 3A. In at least one embodiment, conducting oxides are removed and linear dielectric is directly connected to top electrode 301b and bottom electrodes 301a. In at least one embodiment, dielectric material 313 can include any suitable linear dielectric, where thickness of dielectric film is a range of 1 nm to 20 nm. In at least one embodiment, linear dielectric material 313 comprises a higher-K dielectric material. In at least one embodiment, linear dielectrics include one of: $SIO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In at least one embodiment, first conductive oxide 312a is conformally deposited over bottom electrode 301a. In at least one embodiment, dielectric material 313 is conformally deposited over first conductive oxide 312a. In at least one embodiment, second conductive oxide 312b is conformally deposited over dielectric material 313. In at least one embodiment, top electrode 301b is conformally deposited over second conductive oxide 312b. In at least one embodiment, bottom electrode 301a is in center while top electrode 301b is on an outer circumference of non-planar capacitor structure 300.

In at least one embodiment, material for bottom electrode 301a may include one or more of: Cu, Al, Ag, Au, W, or Co, or their alloys. In at least one embodiment, material for first conductive oxide 312a include: $IrO_2$, $RuO_2$, $PdO_2$, $OsO_2$, or $ReO_3$. In at least one embodiment, conductive oxides are of form $A_2O_3$ (e.g., $In_2O_3$, Fe2O3) and $ABO_3$ type, where 'A' is a rare earth element and 'B' is Mn. In at least one embodiment, material for second conductive oxide 312b may be same as material for first conductive oxide 312a. In at least one embodiment, material for top electrode 301b may include one or more of: Cu, Al, Ag, Au, W, or Co, or their alloys.

In at least one embodiment, a first refractive intermetallic layer (not shown) is formed between dielectric material 313 and first conductive oxide 312a. In at least one embodiment, second refractive intermetallic layer (not shown) is formed between dielectric capacitor material 313 and second conductive oxide 312b. In at least one embodiment, first and second refractive intermetallic layers are directly adjacent to their respective conductive oxide layers and to dielectric capacitor material 313. In at least one embodiment, refractive intermetallic maintains capacitive properties of dielectric capacitor material 313. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, $TiAl_3$; Ni—Al such as $Ni_3Al$, NiAl3, NiAl; Ni—Ti, Ni—Ga, $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B and Mg can markedly enhance other properties. In at least one embodiment, thicknesses of layers of non-planar capacitor structure 300 in x-axis are in range of 1 nm to 30 nm. In at least one embodiment, refractive intermetallic layers are not used for non-planar capacitor structure 300.

Figure 3B:
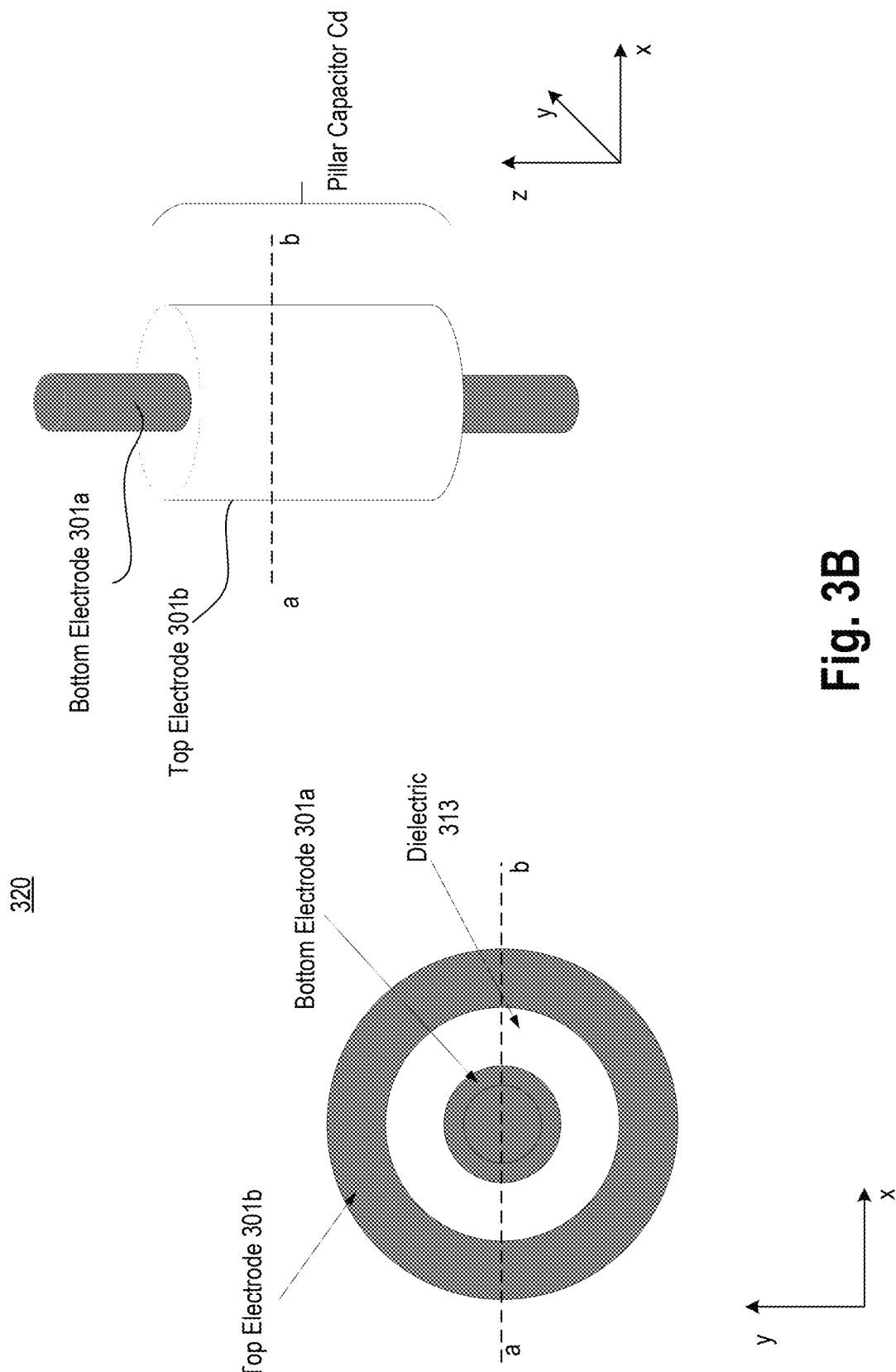
FIG. 3B illustrates a non-planar linear capacitor structure without conductive oxides, in accordance with at least one embodiment.

FIG. 3B illustrates a non-planar linear capacitor structure 320 without conductive oxides, in accordance with at least one embodiment. Compared to FIG. 3A, in at least one embodiment, linear dielectric is adjacent to top electrode and bottom electrode.

Figures 4A, 4B, 4C:
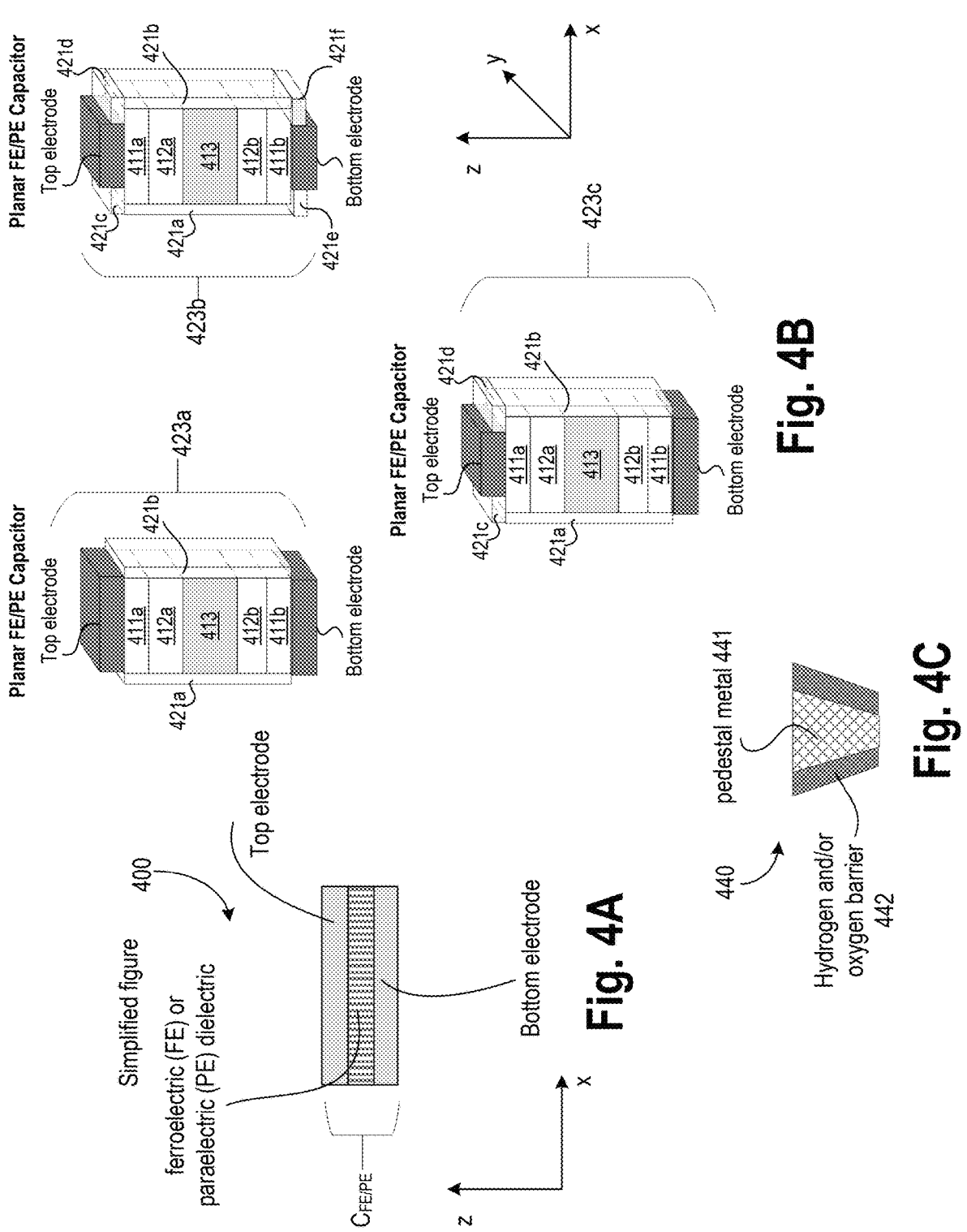
FIG. 4A illustrates a planar ferroelectric or paraelectric capacitor structure, in accordance with at least one embodiment.
FIG. 4B illustrates three planar ferroelectric or paraelectric capacitor structures, respectively, in accordance with at least one embodiment.
FIG. 4C illustrates a pedestal that connects to the top and/or bottom electrodes of the planar ferroelectric or paraelectric capacitor, in accordance with at least one embodiment.

FIG. 4A illustrates a planar ferroelectric or a paraelectric capacitor structure, in accordance with at least one embodiment. FIG. 4B illustrates three planar ferroelectric or para-electric capacitor structures, respectively, in accordance with at least one embodiment.

In at least one embodiment, capacitors are ferroelectric or paraelectric capacitors. In at least one embodiment, capacitors can take any planar form. One such simplified form is illustrated in FIG. 4A, in accordance with at least one embodiment. In at least one embodiment, planar capacitor structure 400 is a metal-insulator-metal (MIM) capacitor comprising a bottom electrode, a top electrode, and a ferroelectric dielectric between top electrode and bottom electrode as shown. In at least one embodiment, conductive oxide layer(s) are formed between bottom electrode and ferroelectric dielectric.

In at least one embodiment, planar capacitor 423a includes encapsulation portions 421a and 421b (also referred to as sidewall barrier seal) that are adjacent to side walls of plurality of layers of planar capacitor. In at least one embodiment, planar capacitor 423c includes encapsulation portions 421c and 421d that are partially adjacent to encap-sulation portions 421a and 421b, and refractive intermetallic 411a. In at least one embodiment, encapsulation portions 421a and 421b extend in z-plane. In at least one embodi-ment, encapsulation portions 421c and 421d terminate into a via (not shown). In at least one embodiment, material for encapsulation portions 421c and 421d is same as those for encapsulation portions 421a and 421b. In at least one embodiment, barrier material for encapsulation portions 421a and 421b includes one or more of an oxide of: Ti, Al, or Mg.

In at least one embodiment, planar capacitor 423b includes encapsulation portions 421e and 421f that are partially adjacent to encapsulation portions 421a and 421b, and refractive intermetallic 411b. In at least one embodi-ment, encapsulation portions 421e and 421f terminate into a via (not shown). In at least one embodiment, encapsulation portions 421e and 421f extend in an x-plane. In at least one embodiment, material for encapsulation portions 421e and 421f is same as those for encapsulation portions 421a and 421b. In at least one embodiment, material for encapsulation portions 421a and 421b includes one or more of: Ti—Al—O, Al$_2$O$_3$, MgO, or nitride. In at least one embodiment, material for encapsulation portions 421a and 421b is a sidewall barrier (e.g., insulative material) that protects stack of layers from hydrogen and/or oxygen diffusion. In at least one embodiment, sidewall barrier material is not an inter-layer dielectric (ILD) material. In at least one embodiment, lateral thickness (along x-axis) of encapsulation portions 421a and 421b (insulating material) is in a range of 0.1 nm to 20 nm. In at least one embodiment, sidewall barriers are in direct contact with ILD.

In at least one embodiment, planar capacitors 423a, 423b, and 423c comprise several layers stacked together to form a planar capacitor. In at least one embodiment, these layers may extend in an x-plane when capacitor is a planar capaci-tor. In at least one embodiment, stack of layers includes refractive intermetallic 411a and refractive intermetallic 411b as a barrier material, conductive oxides 412a, conduc-tive oxide 412b, and ferroelectric material 413. In at least one embodiment, ferroelectric material 413 can be any of ferroelectric materials discussed herein. In at least one embodiment, refractive intermetallic 411a and refractive intermetallic 411b are removed, and electrodes are in direct contact with conductive oxide 412a and conductive oxide 412b.

In at least one embodiment, refractive intermetallic 411a and refractive intermetallic 411b maintain ferroelectric properties of ferroelectric capacitors. In absence of refrac-tive intermetallic 411a and refractive intermetallic 411b, ferroelectric material 413 of a capacitor may lose its potency. In at least one embodiment, refractive intermetallic 411a and refractive intermetallic 411b comprises Ti and Al (e.g., TiAl compound). In at least one embodiment, refrac-tive intermetallic 411a and refractive intermetallic 411b comprises one or more of Ta, W, and/or Co. In at least one embodiment, refractive intermetallic 411a and refractive intermetallic 411b includes a lattice of Ta, W, and Co.

In at least one embodiment, refractive intermetallic 411a and refractive intermetallic 411b is part of a barrier layer which is a super lattice of a first material and a second material, wherein first material includes Ti and Al (e.g., TiAl), and second material includes Ta, W, or Co (e.g., layers of Ta, W, and Co together). In at least one embodiment, lattice parameters of barrier layer are matched with lattice parameters of conductive oxides and/or ferroelectric mate-rial 413.

In at least one embodiment, refractive intermetallic 411a and refractive intermetallic 411b includes one of: Ti—Al such as Ti$_3$Al, TiAl, TiAl$_3$; Ni—Al such as Ni$_3$Al, NiAl$_3$, NiAl; Ni—Ti, Ni—Ga, Ni$_2$MnGa; FeGa, Fe$_3$Ga; borides, carbides, or nitrides. In at least one embodiment, TiAl material comprises Ti-(45-48)Al-(1-10)M (at X trace amount %), with M being at least one element from: V, Cr, Mn, Nb, Ta, W, or Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase y alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta) or combined properties. In at least one embodi-ment, additions such as Si, B, and Mg can markedly enhance other properties. In at least one embodiment, encapsulation portion 421a is coupled to a top electrode. In at least one embodiment, encapsulation portions 421a and 421b (insu-lating material) is placed around refractive intermetallic 411a, conductive oxide 412a, ferroelectric material 413, conductive oxide 412b, and refractive intermetallic 411b while top and bottom surfaces of refractive intermetallic 411a and refractive intermetallic 411b are exposed for coupling to metal layers, vias, or a metallic pedestal.

In at least one embodiment, conductive oxide layer(s) are formed between top electrode and ferroelectric dielectric. In at least one embodiment, conductive oxides include: IrO$_2$, RuO$_2$, PdO$_2$, OsO$_2$, or ReO$_3$. In at least one embodiment, conductive oxides are of form A2O3 (e.g., In$_2$O$_3$, Fe2O$_3$) and ABO$_3$ type, where 'A' is a rare earth element and 'B' is Mn. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

FIG. 4C illustrates pedestal 440 that connects to top and/or bottom electrodes of planar ferroelectric or paraelectric capacitor, in accordance with at least one embodiment. In at least one embodiment, pedestal 440 comprises pedestal metal 441 and sidewall barrier 442. In at least one embodiment, barrier 442 includes materials to protect hydrogen and/or oxygen from interacting with pedestal metal 441. In at least one embodiment, barrier 442 comprises Ti—Al—O, $Al_2O_3$, MgO, or nitride. In at least one embodiment, pedestal metal 441 includes one of Cu, Al, Ag, Au, W, or Co.

FIG. 5A illustrates a non-planar ferroelectric (FE) or a paraelectric (PE) capacitor structure, in accordance with at least one embodiment. In at least one embodiment, non-planar capacitor structure 500 is rectangular in shape. Taking cylindrical shaped case, in at least one embodiment, layers of non-planar capacitor structure 500 from center going outwards include bottom electrode 501a, first conductive oxide 512a, ferroelectric (FE) or paraelectric (PE) dielectric material 513, second conductive oxide 512b, and top electrode 501b. In at least one embodiment, conducting oxides are removed and FE/PE dielectric is directly connected to top electrode 501b and bottom electrode 501a. In at least one embodiment, ferroelectric dielectric material 513 can include any suitable dielectric, where thickness of ferroelectric or paraelectric (FE or PE) dielectric film is a range of 1 nm to 20 nm. In at least one embodiment, ferroelectric or paraelectric dielectric material 513 includes any one of materials discussed herein for ferroelectrics or paraelectric. In at least one embodiment, central region 502 of non-planar capacitor structure 500 is filled with oxide or an insulative material. In at least one embodiment, central region 502 is filled with metal that abuts with bottom electrode 501a to form a thicker bottom electrode.

In at least one embodiment, first conductive oxide 512a is conformally deposited over bottom electrode 501a. In at least one embodiment, ferroelectric or paraelectric dielectric material 513 is conformally deposited over first conductive oxide 512a. In at least one embodiment, second conductive oxide 512b is conformally deposited over ferroelectric or paraelectric dielectric material 513. In at least one embodiment, top electrode 501b is conformally deposited over second conductive oxide 512b. In at least one embodiment, bottom electrode 501a is in center while top electrode 501b is on an outer circumference of non-planar capacitor structure 500.

In at least one embodiment, material for bottom electrode 501a may include one or more of: Cu, Al, Ag, Au, W, or Co, or their alloys. In at least one embodiment, material for first conductive oxide 512a include: $IrO_2$, $RuO_2$, $PdO_2$, $OsO_2$, or $ReO_3$. In at least one embodiment, conductive oxides of form $A_2O_3$ (e.g., $In_2O_3$, $Fe_2O_3$) and $ABO_3$ type, where 'A' is a rare earth element and 'B' is Mn. In at least one embodiment, material for second conductive oxide 512b may be same as material for first conductive oxide 512a. In at least one embodiment, material for top electrode 501b may include one or more of: Cu, Al, Ag, Au, W, or Co, or their alloys.

In at least one embodiment, a first refractive intermetallic layer (not shown) is formed between dielectric material 513 and first conductive oxide 512a. In at least one embodiment, a second refractive intermetallic layer (not shown) is formed between ferroelectric or paraelectric dielectric material 513 and second conductive oxide 512b. In at least one embodiment, first and second refractive intermetallic layers are directly adjacent to their respective conductive oxide layers and to ferroelectric or paraelectric dielectric material 513. In at least one embodiment, refractive intermetallic maintains capacitive properties of ferroelectric or paraelectric dielectric material 513. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase y alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B, or Mg can markedly enhance other properties. In at least one embodiment, thicknesses of layers of non-planar capacitor structure 500 in x-axis are in range of 1 nm to 30 nm. In at least one embodiment, refractive intermetallic layers are not used for non-planar capacitor structure 500.

Figure 5B:
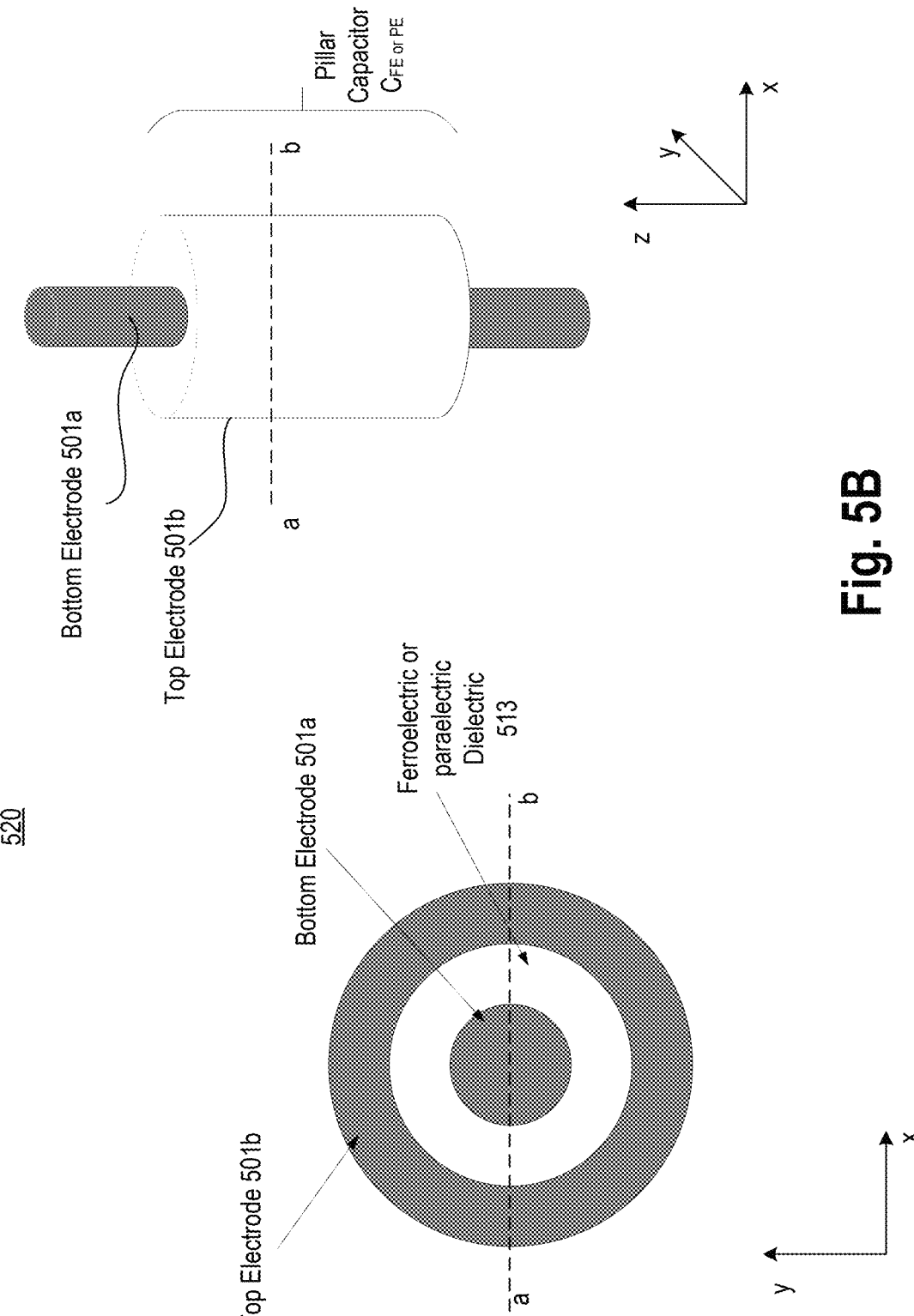
FIG. 5B illustrates a non-planar ferroelectric or paraelectric capacitor structure without conductive oxides, in accordance with at least one embodiment.

FIG. 5B illustrates a non-planar ferroelectric or paraelectric capacitor structure 520 without conductive oxides, in accordance with at least one embodiment. Compared to non-planar capacitor structure 500, here first conductive oxide 512a and second conductive oxide 512b are removed and ferroelectric material 513 is adjacent to top electrode 501b and bottom electrode 501a as shown, in at least one embodiment.

In at least one embodiment, ferroelectric material can be replaced with anti-ferroelectric material. In at least one embodiment, anti-ferroelectric (AFE) material includes lead zirconate titanate (PZT) with high Zr doping, La-doped PZT with high Zr doping, $HfSiO_2$ with high Si doping, $HfZrO_2$ (HZO) with high Zr doping, $ZrO_2$, $PbZrO_3$ (lead zirconate), $NH_4H2PO_4$ (ammonium dihydrogen phosphate (ADP)), $NaNbO_3$ (sodium niobate), and K doped $NaNbO_3$, etc. Table 1 describes some bulk anti-ferroelectric materials, with various physical/chemical modifications for enhancing energy storage density, in at least one embodiment.

TABLE 1

| Material name | Physical/Chemical Modifications | Energy Density (J/cm³) | Electric Field (kV/cm) |
|---|---|---|---|
| (Pb0.97La0.02)(Zr0.97Ti0.03)O3 | 3 wt % glass (PbO-B2O3-SiO2-ZnO) | 3.1 | 581 |
| (Pb0.97La0.02)(Zr0.97Ti0.03)O3 | without glass | 1.4 | 581 |
| Pb0.99Nb0.02[(Zr0.57Sn0.43)1-yTiy]0.98O3 | with half electrode | 1.30 | 70 |
| Pb0.99Nb0.02[(Zr0.57Sn0.43)1-yTiy]0.98O3 | with full electrode | 1.19 | 70 |
| (Pb0.94-xLa0.04Bax)[(Zr0.60Sn0.40)0.841Ti0.16]O3 | x = 0 (0 MPa) | 0.35 | 30 |
| (Pb0.94-xLa0.04Bax)[(Zr0.60Sn0.40)0.841Ti0.16]O3 | x = 0.02 (20 MPa) | 0.38 | 30 |

TABLE 1-continued

| Material name | Physical/Chemical Modifications | Energy Density (J/cm³) | Electric Field (kV/cm) |
|---|---|---|---|
| Pb0.99Nb0.02[(Zr0.60Sn0.40)0.95Ti0.05]O3 | — | 0.62 | 56 |
| Pb0.97La0.02(Zr0.56Sn0.35Ti0.09)O3 | 4 wt % glass (CdO-Bi2O3-PbO-ZnO-Al2O3-B2O3-SiO2) | 3.3 | 150 |
| Pb0.97La0.02(Zr0.56Sn0.35Ti0.09)O3 | Without glass | 1.9 | 110 |
| (Pb0:97La0:02)(Zr0:92Sn0:05Ti0:03)O3 | 3% glass (0.8PbO-0.2B2O3) | 7.4 | 475 |
| (Pb0:97La0:02)(Zr0:92Sn0:05Ti0:03)O3 | Without glass | 4.5 | 320 |
| Pb0.97La0.02(Zr0.95Ti0.05)O3 | — | 12.4 | 1120 |
| (Pb0.85Ba0.08Sr0.03La0.03)(Zr0.74Sn0.22Ti0.04) | — | 1.2 | 100 |
| (Bi1/2Na1/2)0.94Ba0.06]La0.8Zr0.2TiO3 | — | 1.58 | 85 |
| (Ba0.1La0.02)(Zr0.675Sn0.275Ti0.05)O3 | — | 2.05 | 70 |
| 0.75(0.80Bi1/2Na1/2TiO3-0.20Bi1/2K1/2TiO3)-0.25SrTiO3 | — | 0.84 | 100 |
| Pb0.97La0.02(Zr0.50Sn0.45Ti0.05)O3 | — | 5.6 | 400 |
| (Pb0.858Ba0.1La0.02Y0.008)(Zr0.65Sn0.3Ti0.05)O3-(Pb0.97La0.02)(Zr0.9Sn0.05Ti0.05)O3 | — | 4.65 | 200 |
| 0.89Bi0.5Na0.5TiO3-0.06BaTiO3-0.05K0.5Na0.5NbO3 | double stage sintering | 0.90 | 100 |
| (Pb0.858Ba0.1La0.02Y0.008)(Zr0.65Sn0.3Ti 0.05)O3-(Pb0.97La0.02)(Zr0.9Sn0.05Ti0.05)O3 | spark plasma sintering | 6.40 | 275 |
| (Pb0.858Ba0.1La0.02Y0.008)(Zr0.65Sn0.3Ti 0.05)O3-(Pb0.97La0.02)(Zr0.9Sn0.05Ti0.05)O3 | conventional sintering | 4.65 | 200 |
| (Na1 − xCax)(Nb1 − xZrx)O3 x = 0.04 | conventional sintering | 0.91 | 130 |
| (Pb0.92La0.04Ba0.02)[(Zr0.60Sn0.40)0.84Ti0.16]O3 | at 90 MPa | 0.91 | 60 |
| 0.91(Bi0.5Na0.5)TiO3-0.07BaTiO3-0.02(K0.5Na0.5)NbO3 | at 100 MPa | 0.387 | 60 |
| (Pb0.96La0.04)(Zr0.90Ti0.10)O3 | at 100 MPa | 0.698 | 60 |

Figure 6A:
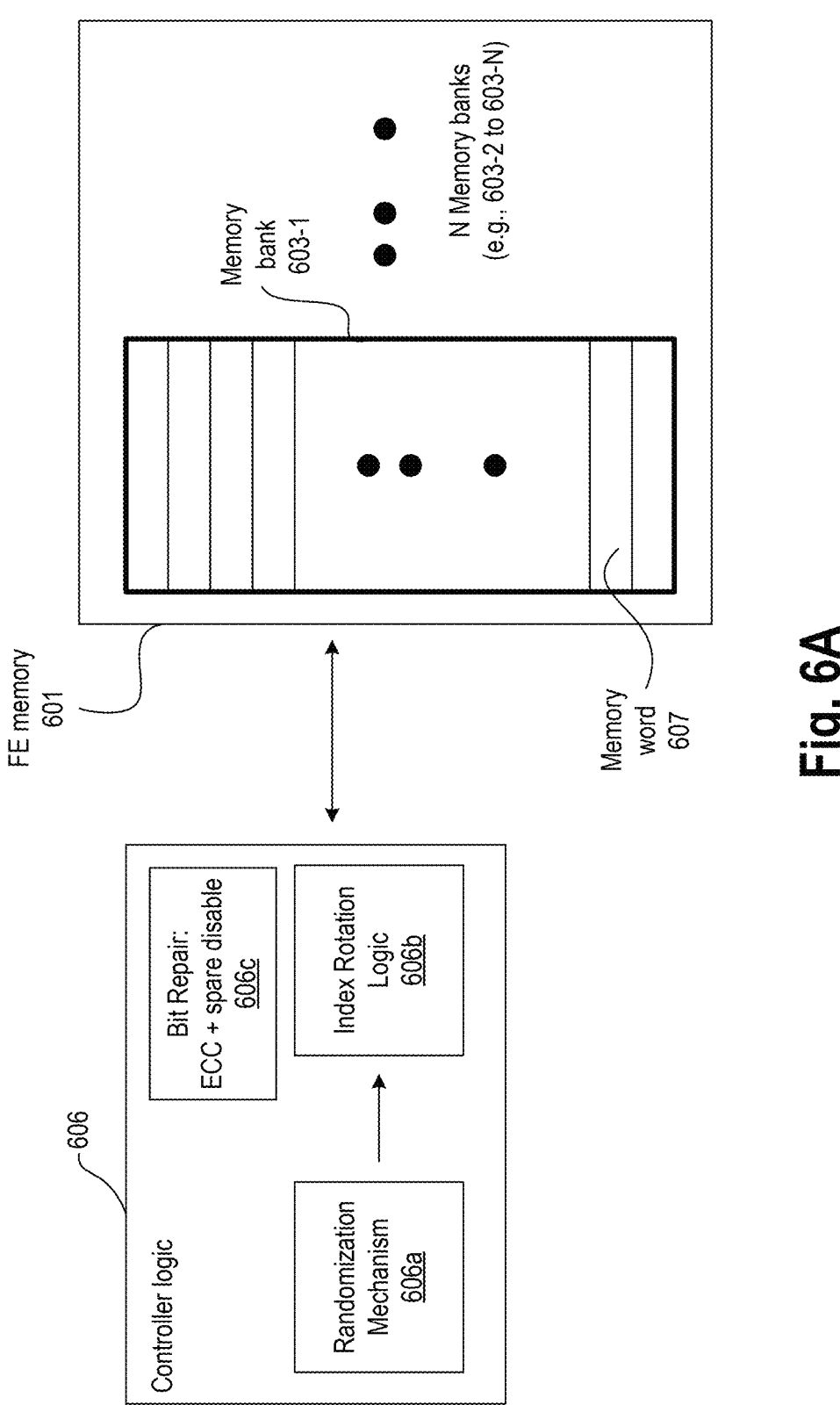
FIG. 6A illustrates a high-level endurance enhancement architecture for a paraelectric (PE) or ferroelectric (FE) memory, in accordance with at least one embodiment.

FIG. 6A illustrates high-level endurance enhancement architecture 600 for paraelectric (PE) or ferroelectric (FE) memory, in accordance with at least one embodiment. In at least one embodiment, architecture 600 comprises memory array 601 and controller logic 606. In at least one embodiment, memory array 601 is memory with non-linear polar material. In at least one embodiment, memory array 601 includes bit-cells that comprise at least one transistor and at least one capacitor coupled to it, where capacitor has non-linear polar material.

In at least one embodiment, memory array 601 includes a plurality of memory banks (e.g., 603-1 through 603-N, where 'N' is a number). In at least one embodiment, each memory bank (e.g., 603-1) includes a plurality of memory words (e.g., memory word 607). In at least one embodiment, each memory word includes a plurality of memory bit-cells. For sake of simplicity, other memory components are not shown, such as write drivers, column multiplexers, sense-amplifiers, etc.

In at least one embodiment, controller logic 606 comprises endurance hardware and/or software to provide memory endurance to memory array 601. In at least one embodiment, memory endurance is used to ensure that write and/or read operations from memory array 601 are reliable. Write endurance is number of programs and erase cycles that when applied to a memory block, bank, or word before memory block, bank, or word, becomes unreliable. In at least one embodiment, endurance mechanisms include a wear leveling scheme that uses index rotation, outlier compensation to handle weak bits, and random swap injection to mitigate wear out attacks. For sake of simplicity, memory banks are generally referred to as reference 603 instead of a particular memory bank reference (e.g., 603-1, 603-2, etc.). At least one embodiment described to general reference is applicable to an individual particular reference. In at least one embodiment, description of memory bank 603 is applicable for memory banks 603-1, 603-2, through 603-N.

In at least one embodiment, controller logic 606 (also referred to as refresh logic) comprises random invertible bit matrix 606a, index rotation logic 606b, and bit repair logic 606c. In at least one embodiment, index rotation logic 606b enables random swap injection which randomizes index rotation to obfuscate mapping from addresses to rotated indexes. In at least one embodiment, index rotation logic 606b randomizes rotation of gap words in memory bank 603. Malicious users (or attackers) may write programs that deliberately track wear leveling schemes described herein. These attackers may attempt to alter a memory reference pattern to continue to stress a single physical line even as wear leveling scheme assigns that physical line to different addresses. In at least one embodiment, index rotation logic 606b provides a facility to make tracking of physical lines difficult. In at least one embodiment, this facility makes a random decision (e.g., using an externally generated random number) to either swap or not each time a swap opportunity arises. In at least one embodiment, over time randomness injected into swapping process makes tracking cache lines more difficult.

In at least one embodiment, index rotation logic 606b is used for implementing a wear leveling scheme. In at least one embodiment, index rotation logic 606b rotates addresses throughout memory bank 603 to perform a wear leveling function. In various embodiments, index rotation logic 606b ensures that memory requests are spread across memory locations rather than a single memory location.

In at least one embodiment, bit repair logic 606c includes double error correcting, or triple error detecting error correction code (ECC) to discover new bit errors and spare disable which eliminate memory words with particularly high error rates. In at least one embodiment, spare disable involves having a buffer of spare cache lines. In at least one embodiment, when cache lines are particularly unreliable, spare disable can swap out unreliable cache lines for reliable spares. In at least one embodiment, spares may be implemented with memory technology other than FE memory such as static random-access memory (SRAM). In at least one embodiment, bit repair logic 606$c$ addresses problem of weak memory bits. In at least one embodiment, each cache line or word 607 in memory bank 603 includes a valid bit. In at least one embodiment, valid bit indicates whether data associated with that line/word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, various endurance mechanisms discussed herein can be used in any combination or order. In at least one embodiment, some memory products may select one or more endurance mechanisms instead of all three discussed herein. In at least one embodiment, some memory products may apply to all three endurance mechanisms to achieve most endurance for memory array 601. In at least one embodiment, endurance mechanisms are applied to memory array 601 to maximize usage of such memory.

Figure 6B:
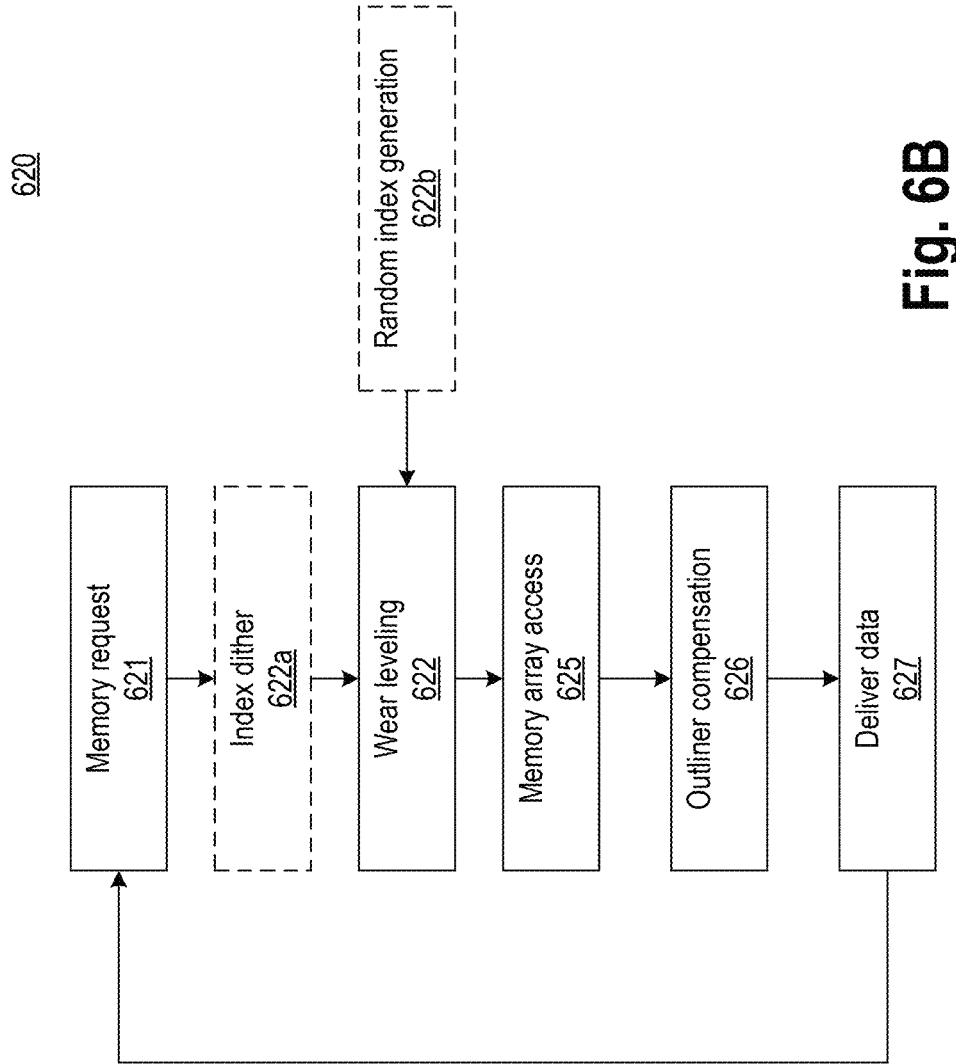
FIG. 6B illustrates a flowchart of memory endurance for PE and FE memory, in accordance with at least one embodiment.

FIG. 6B illustrates flowchart 620 of memory endurance for PE and FE memory, in accordance with at least one embodiment. While blocks in flowchart 620 are illustrated in a particular order, the order can be modified, in at least one embodiment. In at least one embodiment, some blocks may be performed before others based on whether read or write operations are being performed. In at least one embodiment, various blocks can be implemented in hardware, software, or a combination of them.

At block 621, in at least one embodiment, controller logic 606 sends a memory request to memory array 601. In at least one embodiment, this request may be a read request or a write request. In at least one embodiment, if it is a write request, controller logic 606 applies wear leveling scheme at block 622. In at least one embodiment, wear leveling scheme is linear in that a gap word or gap cache line is swapped with an adjacent word or cache line. In at least one embodiment, wear leveling is dithered as indicated by block 622$a$. In at least one embodiment, index or pointer to gap word or gap cache line is used to swap gap word or gap cache line with either an adjacent cell with one higher index or address or with an adjacent cell with one lower index or address. As such, in at least one embodiment, wear leveling is dithered.

In at least one embodiment, wear leveling is randomized. In at least one embodiment, a random index is generated at block 622$b$. In at least one embodiment, random index is then used to swap gap word or gap cache line with an adjacent or a non-adjacent word or cache line. In at least one embodiment, random index is dithered. In at least one embodiment, dithered random index is then used for wear leveling.

In at least one embodiment, if memory request is a read access (as indicated by block 625), outlier compensation is applied as indicated by block 626. At block 626, in at least one embodiment, controller logic 606 addresses problem of weak memory bits by checking a valid bit for memory word being addressed or accessed. In at least one embodiment, valid bit indicates whether data associated with that line or word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, after ECC is applied, requested data is provided to controller logic 606 as indicated by block 627. In at least one embodiment, memory endurance for non-linear polar material based memory is enhanced by endurance mechanisms. In at least one embodiment, this allows more read and write operations to memory before any memory block, bank, or word becomes unreliable. In at least one embodiment, capacitors for each bit-cell in memory array 601 are arranged in a stack and fold manner.

Figure 7A:
FIG. 7A illustrates an MxN memory array of bit-cells and corresponding periphery circuitry where plate-line (PL) is parallel to bit-line (BL) and orthogonal to word-line (WL), in accordance with at least one embodiment.

FIG. 7A illustrates apparatus 700 comprising an MxN memory array of bit-cells and corresponding periphery circuitry where plate-line (PL) is parallel to bit-line (BL) and orthogonal to word-line (WL), in accordance with at least one embodiment. In at least one embodiment, apparatus 700 comprises MxN memory array 701 of bit-cells, logic circuitry 702 for address decoding, logic circuitry 703 for sense amplifier, plate-line (PL) drivers and bit-line drivers, and logic circuitry 704 for word-line (WL) drivers and/or WL repeaters. In at least one embodiment, apparatus 700 comprises endurance hardware and/or software 706 to provide memory endurance to memory array 701.

In at least one embodiment, plate-lines PL0, PL1, through PLN are parallel to bit-lines BL0, BL1, through BLN, while word-lines WL0, WL1, through WLM are orthogonal to plate-lines and bit-lines, where 'N' is a number greater than 1. In at least one embodiment, individual memory bit-cells in memory array 701 are organized in rows and columns. For example, memory bit-cells 701$_{0,0}$ through 701$_{M,N}$ are organized in an array. In at least one embodiment, an individual memory bit-cell (e.g., 701$_{0,0}$) is a 1T1C bit-cell. An example of a 1T1C bit-cell is described with reference to FIGS. 8A-B. In at least one embodiment, a bit-cell of MxN memory array 701 is a unit cell which can have multiple 1T1C bit-cells associated with a bit-line. Examples of unit cells are described with reference to FIGS. 18-47. In at least one embodiment, unit cells are of same type (e.g., homogenous designs). In at least one embodiment, unit cells are of different types (e.g., heterogeneous designs).

Figure 7B:
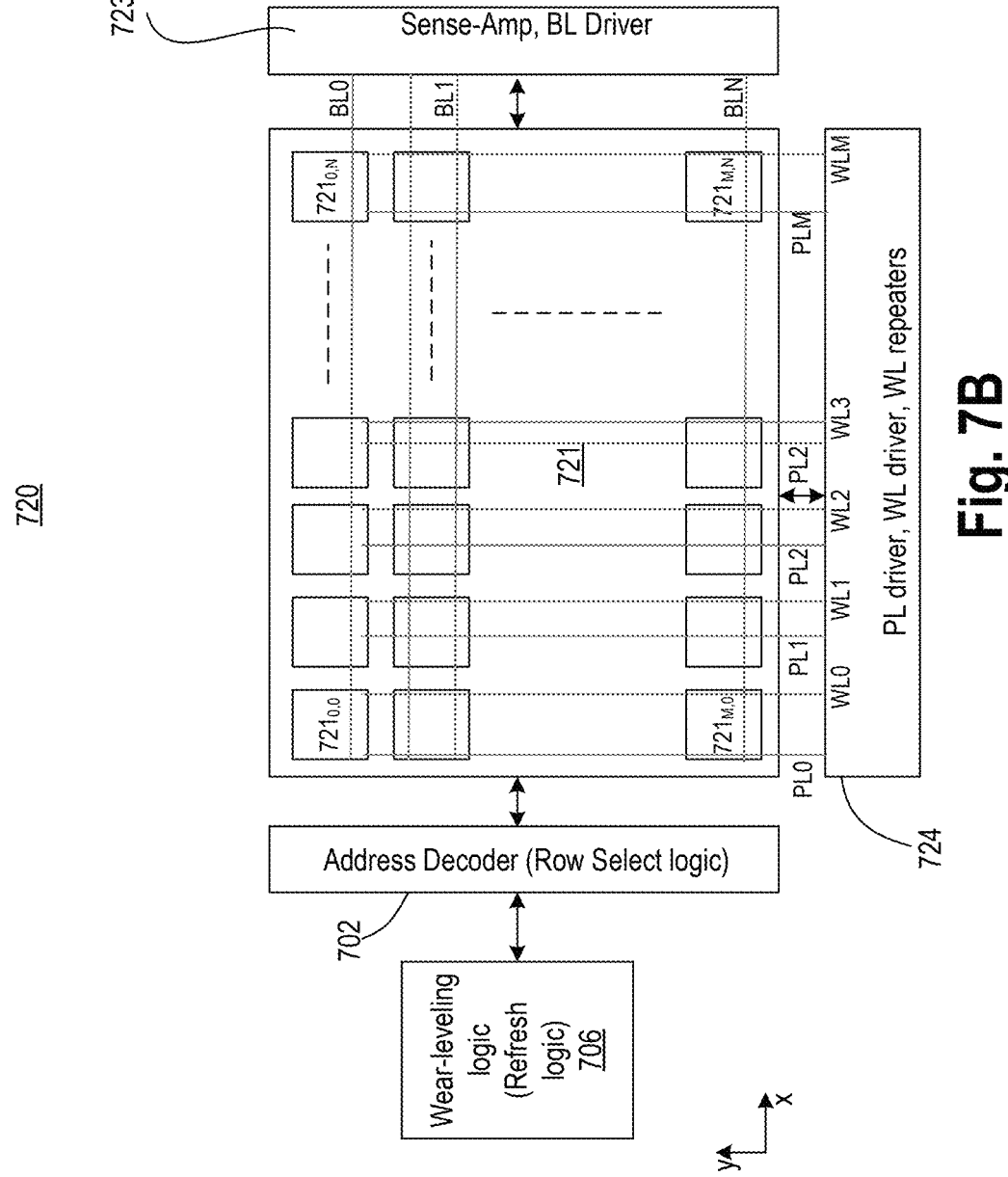
FIG. 7B illustrates an MxN memory array of bit-cells and corresponding periphery circuitry where PL is parallel to WL and orthogonal to BL, in accordance with at least one embodiment.

FIG. 7B illustrates apparatus 720 comprising an MxN memory array 721 of bit-cells and corresponding periphery circuitry where PL is parallel to WL and orthogonal to bit-line (BL), in accordance with at least one embodiment. In at least one embodiment, apparatus 720 comprises MxN memory array 721 of bit-cells, logic circuitry 702 for address decoding, logic circuitry 723 for sense amplifier, and bit-line drivers, and logic circuitry 724 for PL drivers, WL drivers and/or WL repeaters. In at least one embodiment, plate-lines PL0, PL1, through PLM are parallel to word-lines WL0, WL1, through WLM while bit-lines BL0, BL1, through BLN are orthogonal to plate-lines and word-lines, where 'N' and 'M' are numbers greater than 1. In at least one embodiment, apparatus 720 comprises endurance hardware and/or software 706 to provide memory endurance to memory array 721.

Figures 8A, 8B:
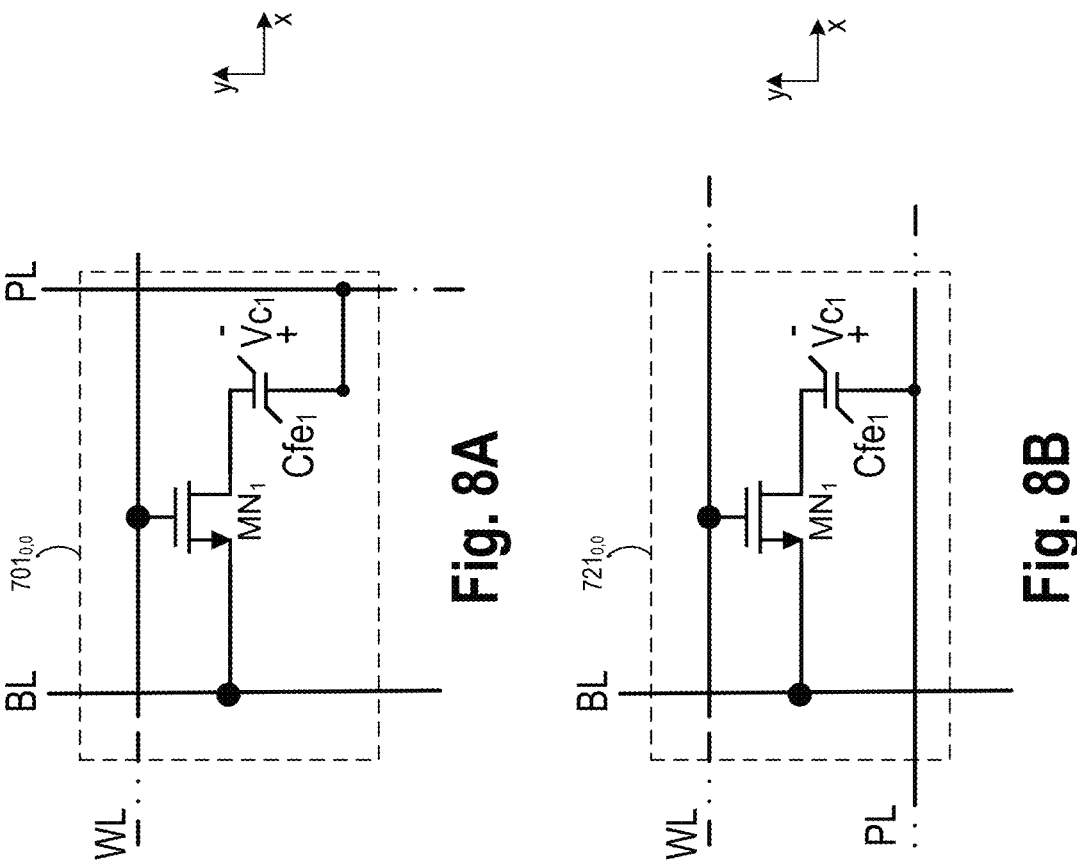
FIG. 8A illustrates 1T1C bit-cell where BL is parallel to PL, in accordance with at least one embodiment.
FIG. 8B illustrates 1T1C bit-cell where PL is parallel to WL, in accordance with at least one embodiment.

FIG. 8A illustrates 1T1C bit-cell 800 (e.g., 701$_{0,0}$) where BL is parallel to PL, in accordance with at least one embodiment. In at least one embodiment, 1T1C bit-cell 800 comprises a transistor and a capacitor. In at least one embodiment, transistor is an n-type transistor $MN_1$ with a gate terminal coupled or controllable by WL, a source terminal coupled to BL, and a drain terminal coupled to a first terminal of capacitor $Cfe_1$. In at least one embodiment, a second terminal of capacitor is coupled to PL. In at least one embodiment, transistor is a p-type transistor. In at least one embodiment, capacitor of 1T1C bit-cell 800 is a capacitor according to any one of FIG. 2, FIG. 3A, FIG. 3B, FIGS. 4A-C, FIG. 5A, or FIG. 5B. In at least one embodiment, capacitor of 1T1C bit-cell 800 is replaced with a planar memory element structure. In at least one embodiment, planar memory element structure is a resistive element. In at least one embodiment, planar memory element structure is a magnetic tunnel junction (MTJ). In at least one embodiment, planar memory element structure is phase change memory (PCM) based element.

FIG. 8B illustrates 1T1C bit-cell 820 (e.g., 721$_{0,0}$) where PL is parallel to WL, in accordance with at least one embodiment. In at least one embodiment, 1T1C bit-cell 820 is like 1T1C bit-cell 800 but with different orientation of PL relative to WL. Here, BL is orthogonal to WL and PL, where PL and WL are parallel to one another. Depending on orientation of BL, PL, and WL relative to one another, memory architecture can be redesigned to achieve desired performance.

Figure 9:
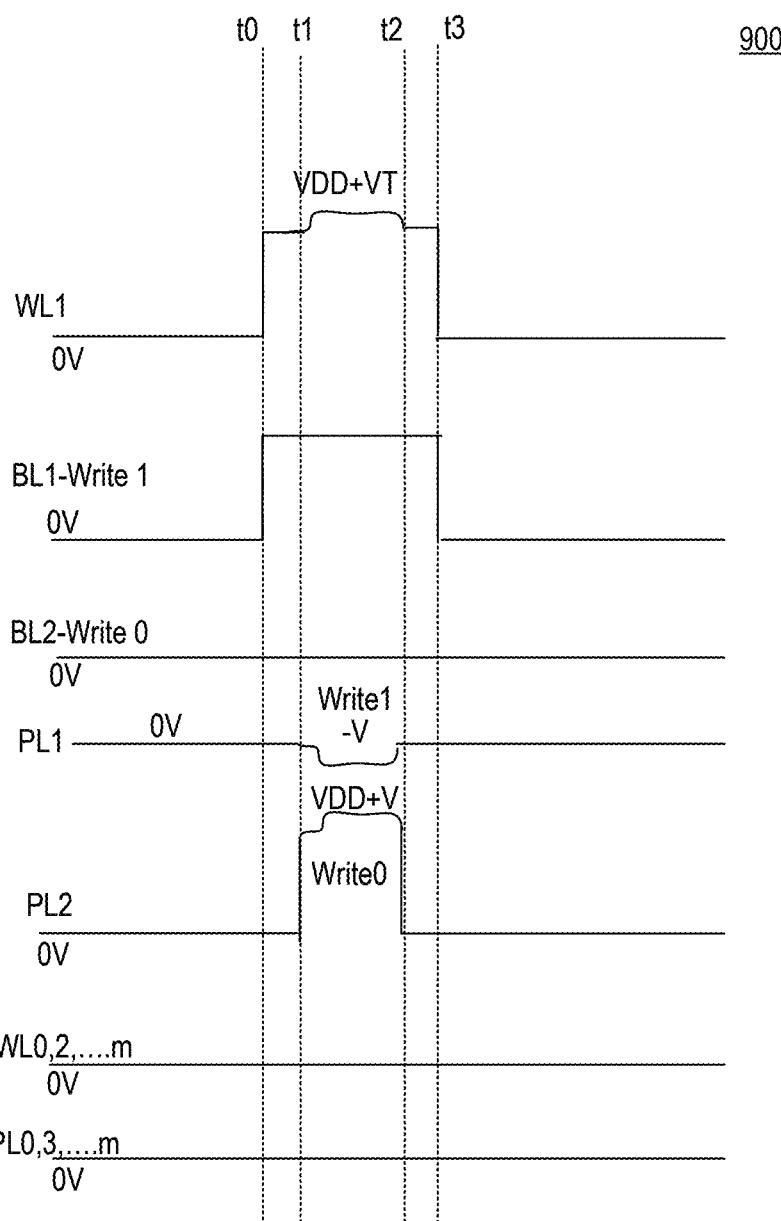
FIG. 9 illustrates a timing diagram of write operation for a 1T1C bit-cell with PL parallel to BL and with PL boosting, in accordance with at least one embodiment.

FIG. 9 illustrates timing diagram 900 of write operation for a 1T1C bit-cell with PL parallel to BL and with PL boosting, in accordance with at least one embodiment. In at least one embodiment, operations or events shown in timing diagram 900 can be performed or controlled by hardware (e.g., one or more circuitries in a memory controller or logic described with reference to FIG. 7A), software, or a combination of them. Software to control write operations can be provided as machine-readable instructions that when executed by one or more circuitries, write operation functions are performed.

on WL by threshold voltage (Vt) of access transistor $MN_1$. In at least one embodiment, WL driver of logic circuitry 704 does not boost WL and asserts voltage of WL to nominal supply voltage level VDD during write operation.

In at least one embodiment, when WL driver of logic circuitry 704 writes a logic 1 to selected bit-cell (e.g., when BL1-Write 1 is asserted between time point t0 and time point t3), PL driver of logic circuitry 703 negatively boosts associated plate-line (e.g., PL1) from ground by voltage −V. In at least one embodiment, magnitude of V is equal to or substantially equal to threshold voltage Vt. In at least one embodiment, PL driver of logic circuitry 703 negatively boosts associated plate-line (e.g., PL1) for write 1 operation for a duration less than pulse width of associated bit-line (e.g., BL1-Write1).

In at least one embodiment, since PL is parallel to BL and orthogonal to WL, PL driver of logic circuitry 703 can perform write 0 operation on a second bit-cell (e.g., 701$_{2,1}$) controlled by the same WL (e.g., WL1) used for write 1 operation of a first bit-cell (e.g., 701$_{1,1}$). In at least one embodiment, bit-line (e.g., BL2) for second bit-cell (e.g., 701$_{2,1}$) is set to 0V to write a logic 0 value (e.g., as such BL2 is indicated as BL2-Write0). In at least one embodiment, signaling for write 0 operations is same for read operations. In at least one embodiment, other bit-cells on the same word-line may be written logic value 1 or 0 and their corresponding BLs and PLs are set as discussed for first bit-cell and second bit-cell. In at least one embodiment, for unselected bit-cells of different word-lines (e.g., WL0, 2, . . . m) and plate-lines (e.g., PL0, 3, . . . m) word-line drivers of logic circuitry 704 and plate-line drivers of logic circuitry 703 drive 0V on those unselected word-lines and plate-lines.

Table 2 summarizes voltages for selected and unselected rows for write 1 and write 0 (e.g., read) operations.

TABLE 2

| | | PL | WL | BL | SN | VBL − bulk | VSN − bulk | \|VFE\| |
|---|---|---|---|---|---|---|---|---|
| Write 1 | Selected row | −Vplbst | VDD + Vwlbst | VDD | VDD-Vt + Vwlbst | VDD | VDD − Vt + Vwlbst | VDD-Vt + Vwlbst + Vplbst |
| | Unselected row | −Vplbst | 0 | VDD | Approx. − Vplbst* | VDD | −Vplbst | Appox. 0* |
| Write 0 (Read) | Selected Row | VDD + Vplbst | VDD + Vwlbst | 0 | 0 | 0 | 0 | VDD + Vplbst |
| | Unselected row | VDD + Vplbst | 0 | 0 | ~(VDD + Vplbst)* | 0 | VDD + Vplbst | Appox. 0* |

In at least one embodiment, write operation begins at time point t0 and ends at time point t3. In at least one embodiment, BL driver of logic circuitry 703 activates bit-line (e.g., BL1) and WL driver of logic circuitry 704 activates a word-line (e.g., WL1) to select a bit-cell (e.g., 701$_{1,1}$) in that row of memory array for writing logic value 1. In at least one embodiment, BL driver of logic circuitry 703 activates or asserts bit-line (e.g., BL1) from 0V to VDD between time point t0 to time point t3. In at least one embodiment, WL driver of logic circuitry 704 activates or asserts word-line (e.g., WL1) from 0V to VDD between time point t0 to time point t3. In at least one embodiment, during write operation, WL driver of logic circuitry 704 boosts voltage on WL between time point t1 and time point t2. In at least one embodiment, WL driver of logic circuitry 704 boosts voltage Where '*' refers to capacitive divider with the parasitic capacitor and capacitor of 1T1C which determines $|V_{FE}|=|V_{SN}-V_{PL}|$, where $V_{wlbst}$ is boost voltage add on to WL voltage, where $V_{wlbst}$ is positive boost voltage add on to PL voltage, and where $V_{wlbst}$ is negative boost voltage add on to PL voltage.

Figure 10:
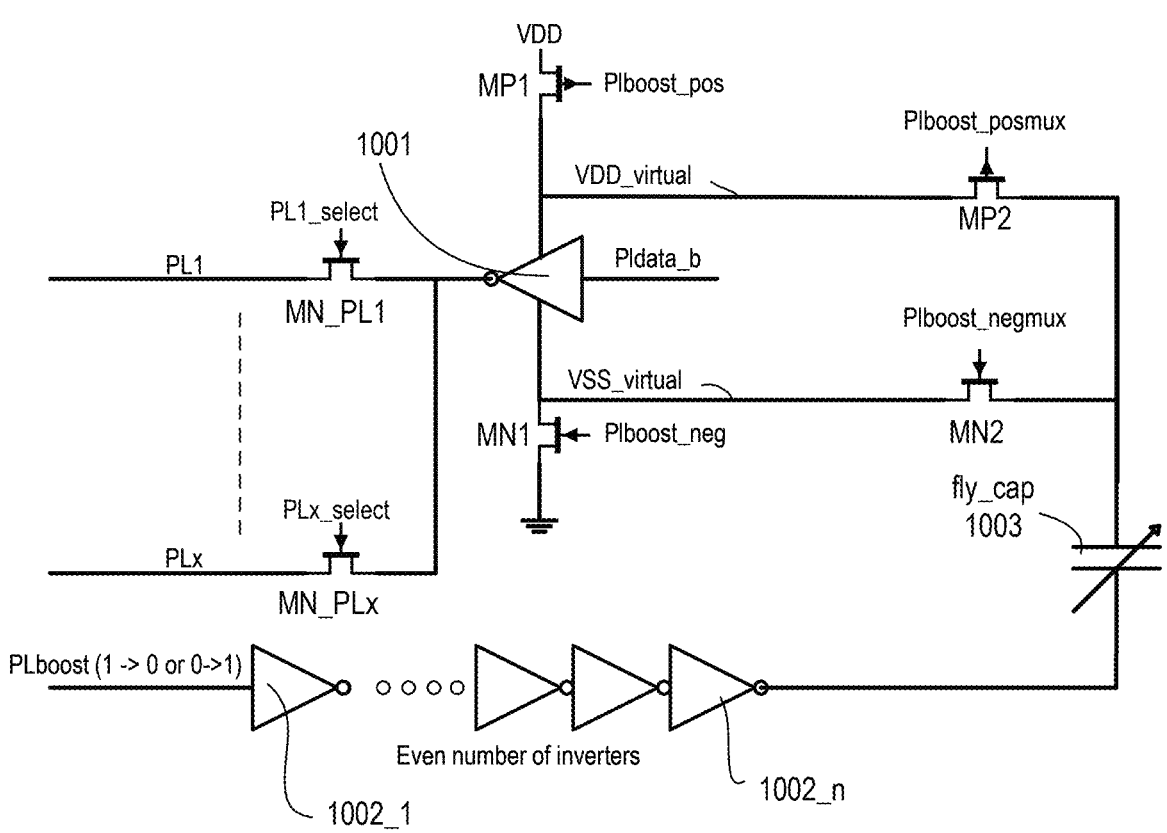
FIG. 10 illustrates a PL boosting circuitry for memory array with PL parallel to BL, in accordance with at least one embodiment.

FIG. 10 illustrates PL boosting circuitry 1000 for memory array with PL parallel to BL, in accordance with at least one embodiment. In at least one embodiment, PL boosting circuitry 1000 comprises PL driver 1001, PL boost inverter chain with inverter 10021 through inverter 1002_n, fly-capacitor fly_cap 1003, p-type supply pull-up transistor MP1, n-type ground pull-down transistor MN1, p-type virtual supply pass-gate MP2, n-type virtual supply pass-gate MN2, PL1 select pass-gate MN_PL1 through PLx select pass-gate MN_PLx coupled as shown.

In at least one embodiment, PL driver 1001 drives Pldate_b to plate-lines. In at least one embodiment, a first terminal of fly_cap 1003 is coupled to p-type virtual supply pass-gate MP2 and n-type virtual supply pass-gate MN2. In at least one embodiment, second terminal of fly_cap 1003 is coupled to last driver or inverter 1002_n of inverter chain. In at least one embodiment, Plboost_posmux controls gate of p-type virtual supply pass-gate MP2. In at least one embodiment, Plboost_negmux controls gate of n-type virtual supply pass-gate MN2. In at least one embodiment, Plboost_pos controls gate of p-type virtual supply pass-gate MP2. In at least one embodiment, Plboost_neg controls gate of n-type virtual supply pass-gate MN2. In at least one embodiment, PL1_select controls PL1 select pass-gate MN_PL1, and PLx_select controls MN_PLx. In at least one embodiment, fly_cap is larger in size than capacitor of 1T1C bit-cell. In at least one embodiment, fly_cap is according to any one of capacitors of FIG. 2, FIGS. 3A-B, or FIGS. 4A-C.

In at least one embodiment, fly_cap 1003 is used to generate both positive and negative boost to selected PL. In at least one embodiment, inverter chain delays propagation of PLboost signal to yank second terminal of fly_cap 1003 (and thus first terminal of fly_cap 1003) from logic 1 to logic 0 (or logic 0 to logic 1). In at least one embodiment, chain of inverters 1002_1 through 1002_n, where 'n' is an integer, is even number of inverters. In at least one embodiment, chain of inverters including inverter 10021 through inverter 1002_n has a programmable delay (e.g., programmable by software, hardware, or a combination of them). In at least one embodiment, delayed PLboost is used to generate negative boost on VSS_virtual or positive boost on VDD_virtual. In at least one embodiment, PLboost goes back to precharge state to setup for next operation. In at least one embodiment, boost (positive or negative) is data dependent and can be different from different columns or rows of memory array.

In at least one embodiment, to positively boost voltage on PL1, Plboost_pos transitions from logic 0 to 1 which causes VDD_virtual to initially charge to VDD (when transistor MP1 was on). In at least one embodiment, Plboost_neg is logic 1, which keeps transistor MN1 on (e.g., VSS_virtual is coupled to ground). In at least one embodiment, transistor MP2 is turned on by setting Plboost_posmux to logic 0, which causes voltage of VDD_virtual to couple to first terminal of fly_cap 1003. In at least one embodiment, PLboost is toggled from logic 0 to logic 1, which causes the second terminal of fly_cap 1003 to charge up. This charge transfers from second terminal of fly_cap 1003 to first terminal of fly_cap 1003, which in turn increases voltage on VDD_virtual. In at least one embodiment, higher supply voltage for driver 1001 results in higher output of driver 1001 (e.g., higher than VDD). This higher voltage is then couples to PL1 by turning on transistor MN_PL1 by setting PL1_select to 1.

In at least one embodiment, to negatively boost voltage on PL1, Plboost_neg transitions from logic 1 to 0 which causes Vss_virtual to initially discharge to Vss (when transistor MN1 was on). In at least one embodiment, Plboost_pos is logic 0, which keeps transistor MP1 on (e.g., VDD_virtual is coupled to VDD). In at least one embodiment, transistor MN2 is turned on by setting Plboost_negmux to logic 0, which causes voltage of Vss_virtual to couple to first terminal of fly_cap 1003. In at least one embodiment, PLboost is toggled from logic 1 to logic 0, which causes the second terminal of fly_cap 1003 to discharge. This charge transfers from the second terminal of fly_cap 1003 to first terminal of fly_cap 1003, which in turn decreases voltage on Vss_virtual. In at least one embodiment, lower ground supply voltage for driver 1001 results in lower output of driver 1001 (e.g., lower than ground). This lower voltage is then coupled to PL1 by turning on transistor MN_PL1 by setting PL1_select to logic 1. Plboost then goes back to precharge state to setup for next operation.

Table 3 summarizes the operation of PL boosting circuitry 1000.

TABLE 3

| State | Plboot | Plboost_neg | Plboost_negmux | Plboost_pos | Plboost_posmux |
|---|---|---|---|---|---|
| Negative boost | 1→0 | 1→0 | 1 | 0 | 1 |
| Positive boost | 0→1 | 1 | 0 | 0→1 | 0 |
| Precharge 0 | 0 | 1 | 0 | 0 | 0 |
| Precharge 1 | 1 | 1 | 1 | 0 | 1 |

In at least one embodiment, half of PL boosting circuitry 1000 can be configured to positively boost voltage on word-line. In one such embodiment, transistor MN2 is removed, transistor MN1 is removed and ground is directly connected to driver 1001. In at least one embodiment, driver 1001 drives a word-line signal instead of a plate-line signal. In at least one embodiment, PLboost signal is replaced with word-line boost signal.

Figure 11:
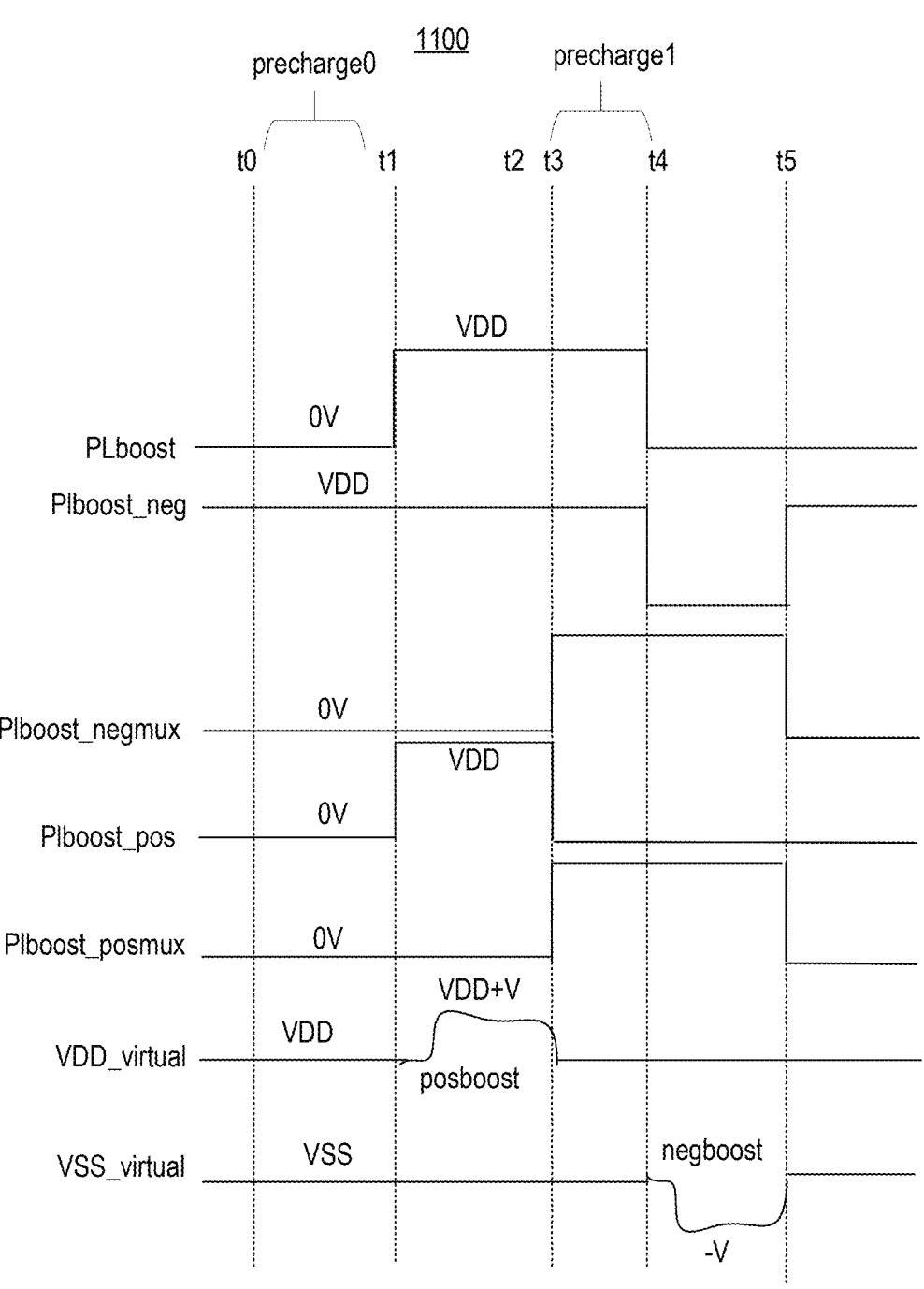
FIG. 11 illustrates a timing diagram showing the operation of PL boosting circuitry, in accordance with at least one embodiment.

FIG. 11 illustrates timing diagram 1100 showing operation of PL boosting circuitry 1000, in accordance with at least one embodiment. In at least one embodiment, PL boosting circuitry 1000 pre-charges various nodes to 0V (e.g., ground) as indicated by precharge0 phase between time points t0 and t1. In at least one embodiment, PLboost is set to 0V to pre-charge the second terminal of fly_cap 1003. In at least one embodiment, during pre-charge phase (between time points t0 and t1), a control circuitry (not shown) sets PLboost to 0V, Plboost_neg to VDD, Plboost_negmux to 0V, Plboost_pos to 0V, and Plboost_posmux to 0V.

In at least one embodiment, PL boosting circuitry 1000 positively boosts voltage on selected PL by positively boosting VDD_virtual. In one such embodiment, PLboost is set to VDD, Plboost_neg remains at VDD, Plboost_negmux remains at 0V, Plboost_pos is set to VDD, and Plboost_posmux remains at 0V, and these controls cause VDD_virtual to boost by +V voltage. In at least one embodiment, VDD+V boosted voltage on VDD_virtual is passed on to selected PL through driver 1001. In at least one embodiment, before negative boosting of a selected PL, one or more nodes of PL boosting circuitry 1000 are pre-charged to logic 1 as indicated by precharge1 phase between time points t3 and t4.

In at least one embodiment, in precharge1 phase, PLboost is set to VDD to pre-charge the second terminal of fly_cap 1003. In at least one embodiment, during pre-charge phase (between time points t3 and t4), a control circuitry (not shown) sets PLboost to VDD, Plboost_neg to VDD, Plboost_negmux to VDD, Plboost_pos to 0V, and Plboost_posmux to VDD. In at least one embodiment, precharge0 phase is performed prior to positively boosting VDD_virtual (which positively boosts selected PL). In at least one embodiment, precharge1 phase is performed prior to negatively boosting VSS_virtual (which negatively boosts selected PL).

In at least one embodiment, PL boosting circuitry 1000 negatively boosts voltage on selected PL by negatively boosting voltage on VSS_virtual. Here, signal names and node names are interchangeably used. For example, VDD may refer to node VDD (or rail VDD) or VDD supply voltage depending on context of sentence. In at least one embodiment, PLboost is set to VSS (0V), Plboost_neg is de-asserted to VSS (0V), Plboost_negmux remains at VDD, Plboost_pos remains at VSS, and Plboost_posmux remains at VDD, and these controls cause VSS_virtual to boost by −V voltage. In at least one embodiment, VSS-V negatively boosted voltage on VSS_virtual is passed on to selected PL through driver 1001. In at least one embodiment, before next positive boosting of a selected PL, one or more nodes of PL boosting circuitry 1000 are pre-charged to logic 0 as indicated by precharge0 phase between time points t0 and t1. In at least one embodiment, positive boost amount +V and negative boost amount −V have a magnitude equal to or substantially equal to threshold voltage of access transistor of 1T1C memory bit-cell.

Figure 12:
FIG. 12 illustrates a negative PL boosting circuitry for memory array with PL parallel to BL, in accordance with at least one embodiment.
Figure 12:
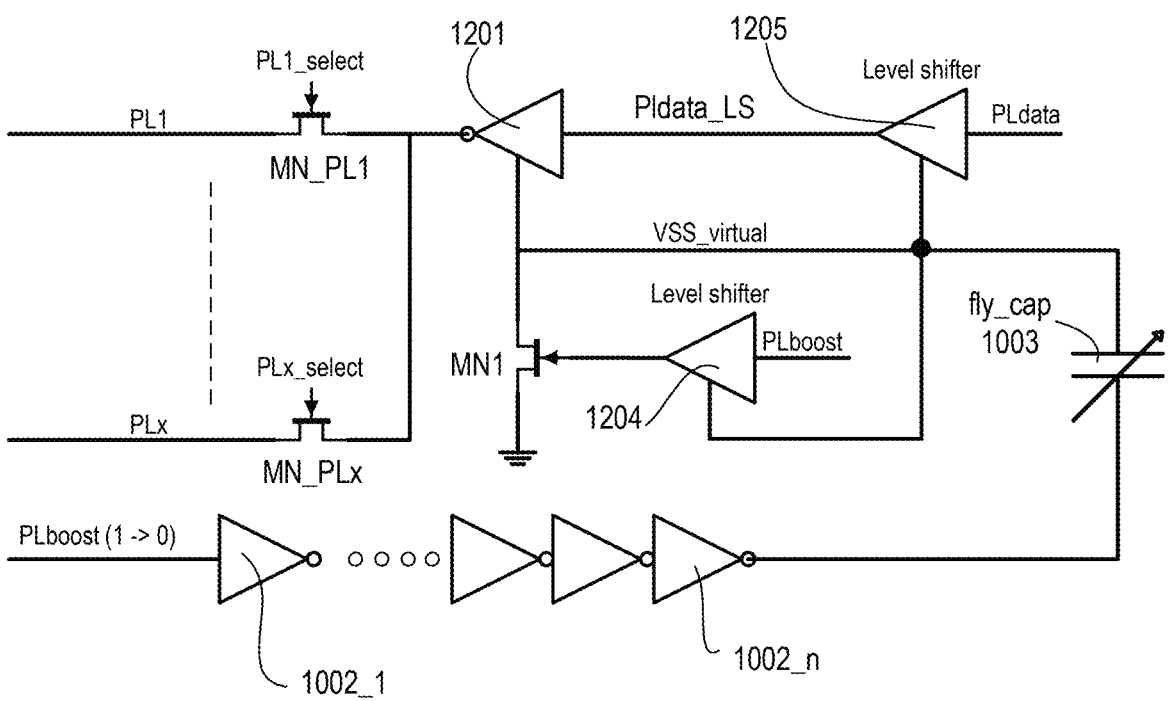

FIG. 12 illustrates negative PL boosting circuitry 1200 for memory array with PL parallel to BL, in accordance with at least one embodiment. In at least one embodiment, negative PL boosting circuitry 1200 is similar to PL boosting circuitry 1000 but without circuitry to positively boost VDD_virtual. In at least one embodiment, negative PL boosting circuitry 1200 has a supply node tied to or coupled to VDD.

In at least one embodiment, negative PL boosting circuitry 1200 comprises PL driver 1201, PL boost inverter chain with inverter 10021 through inverter 1002_n, fly-capacitor fly_cap 1003, n-type ground pull-down transistor MN1, level-shifter 1204, PL1 select pass-gate MN_PL1 through PLx select pass-gate MN_PLx coupled as shown.

In at least one embodiment, to negatively boost PL, PLboost is toggled from VDD to 0V, and this transition from VDD to 0V propagates through inverter chain to second terminal of fly_cap 1003. In at least one embodiment, to negatively boost PL, n-type ground pull-down transistor MN1 is turned off by level-shifter 1204. In at least one embodiment, charge from VSS_virtual flows from first terminal to second terminal of fly_cap 1003 resulting in lowering of voltage on VSS_virtual. This lower voltage on VSS_virtual causes driver 1201 to operate with a ground which is lower than 0V (e.g., VSS-V), in accordance with at least one embodiment. In at least one embodiment, level-shifter 1205 is removed and PLdata is directly provided to driver 1201. In at least one embodiment, selected PL (e.g., selected by controls PL1_select through PLx_select) receives negatively boosted output of driver 1201. After boosting process is complete and data is written to bit-cell, PLboost is set back to VDD, in accordance with at least one embodiment.

Figure 13:
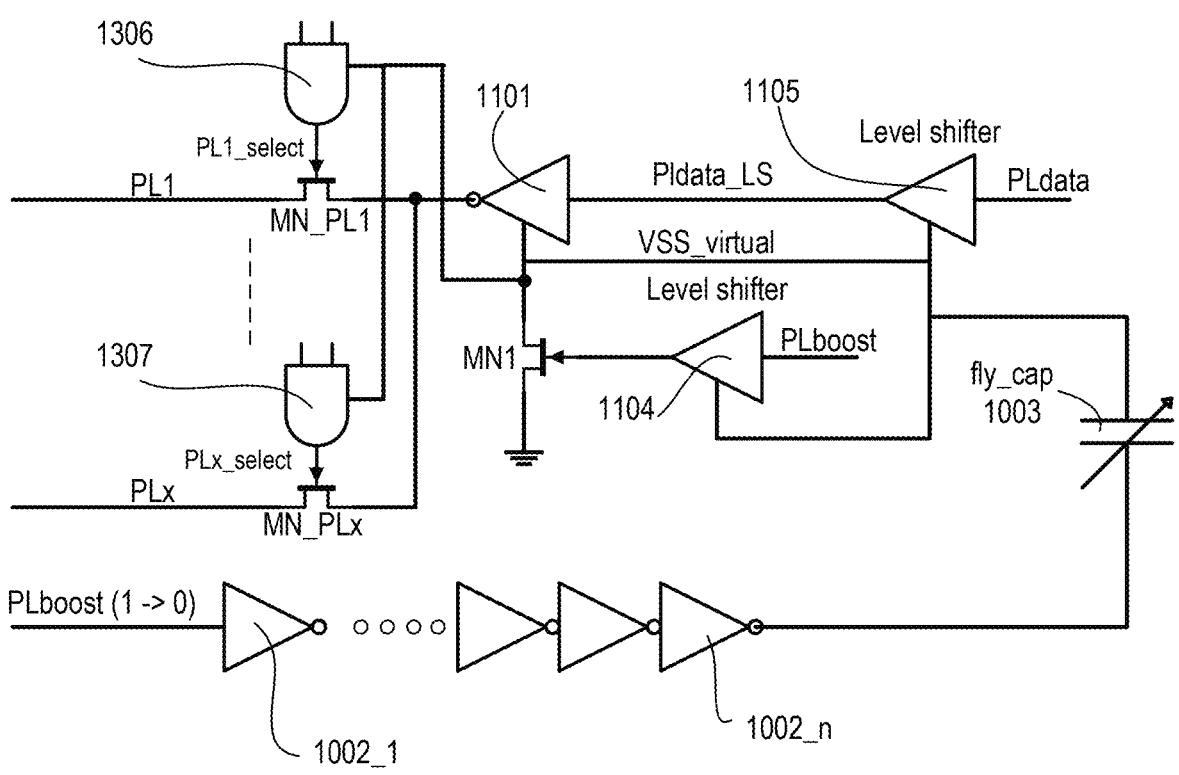
FIG. 13 illustrates a negative PL boosting circuitry for memory array with PL parallel to BL, in accordance with at least one embodiment.

FIG. 13 illustrates negative PL boosting circuitry 1300 for memory array with PL parallel to BL, in accordance with at least one embodiment. In at least one embodiment, negative PL boosting circuitry 1300 is similar to negative PL boosting circuitry 1200 but with NAND or AND gates 1305 and 1307 that drive respective PL pass-gates. In at least one embodiment, ground terminal of NAND or AND gate is connected to VSS_virtual. In at least one embodiment, NAND or AND gates 1305 and 1307 fully turn on PL pass gates when negatively boosted voltage is being provided to selected PL. In at least one embodiment, PL selection pass-gate or multiplexer is driven by logic gate (e.g., AND gate 1305 and 1307). One technical effect of negative PL boosting circuitry 1300 is that it reduces leakage from unselected PL pass-gates and improves boost effectiveness.

Figure 14A:
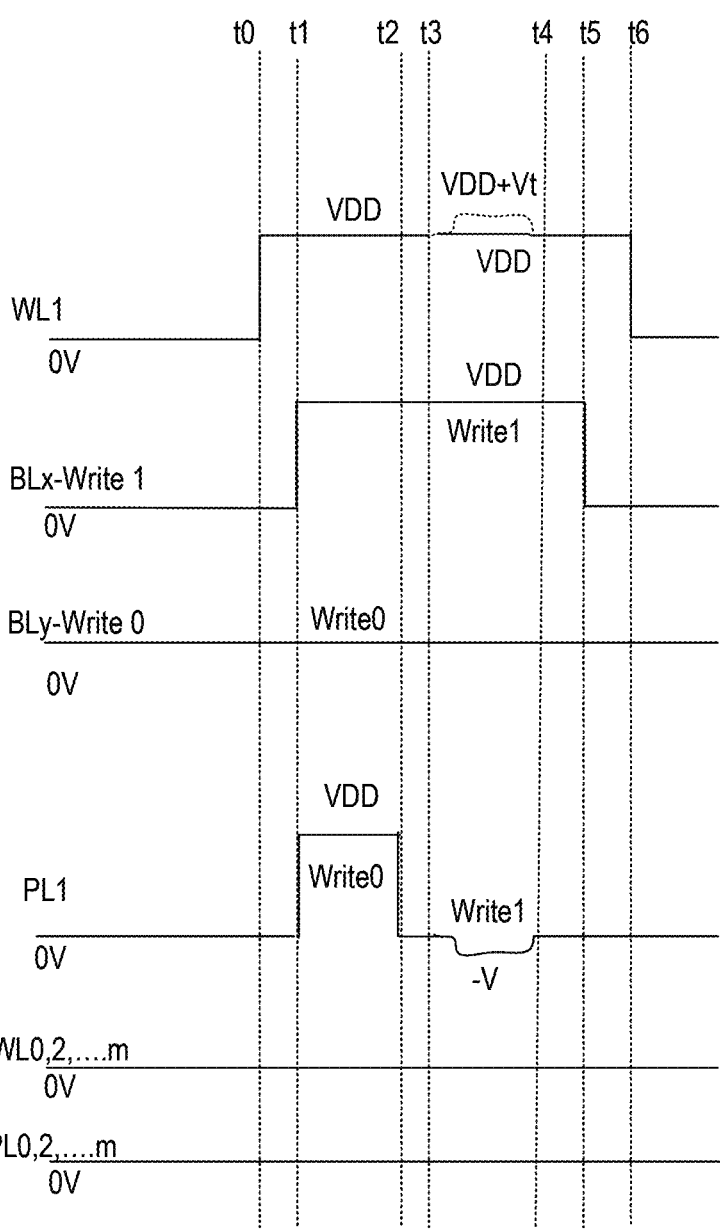
FIG. 14A illustrates a timing diagram of 2-phase write 1 operation with negatively boosted PL for a 1T1C bit-cell with PL parallel to WL, in accordance with at least one embodiment.

FIG. 14A illustrates timing diagram 1400 of 2-phase write 1 operation with negatively boosted PL for a 1T1C bit-cell with PL parallel to WL, in accordance with at least one embodiment. In at least one embodiment, operations or events shown in timing diagram 1400 can be performed or controlled by hardware (e.g., one or more circuitries in a memory controller or logic described with reference to FIG. 7B), software, or a combination of them. Software to control write operations can be provided as machine-readable instructions that when executed by one or more circuitries, write operation functions are performed.

In at least one embodiment, write operation is performed in two phases. In at least one embodiment, a first phase is a write 0 operation followed by a second phase which is write 1 operation. In at least one embodiment, for write 0 operation, PL boosting circuitry boosts voltage on selected PL to −V. In at least one embodiment, voltage drop across capacitor of selected 1T1C bit-cell is VDD for both write 0 and write 1 operation when magnitude of boosted voltage is equal to threshold voltage of transistor of 1T1C bit-cell.

In at least one embodiment, to write logic 1 to selected bit-cell, WL driver of logic circuitry 724 asserts WL for that bit-cell (e.g., WL1 is charged to VDD) as indicated by WL1 pulse between time points t0 and t6. In at least one embodiment, BL driver of logic circuitry 723 asserts bit-line which is selected for write 1 operation from 0V to VDD between asserted pulse of WL1 (e.g., BLx-Write1 is asserted between time points t1 and t5). In at least one embodiment, BL driver of logic circuitry 723 de-asserts, to 0V, bit-line which is selected for write 0 operation (e.g., BLy-Write0 is de-asserted between time points t1 and t5). In at least one embodiment, PL driver of logic circuitry 724 asserts selected PL to VDD for write 0 operation, where write 0 operation ends at time point t2.

In at least one embodiment, for write 1 operation, PL boosting circuitry negatively boosts voltage of selected PL (e.g., PL1) by −V (as indicated by negatively boosting between time points t3 and t4). In at least one embodiment, write 1 operation is performed after write 0 operation. In at least one embodiment, write 1 operation comprises a first phase where write 0 operation is performed (e.g., from time point t1 to time point t2) and a second phase where 1 operation is performed (e.g., from time point t3 to time point t4). In at least one embodiment, BL for write 1 operation is de-asserted after voltage of selected PL is brought back to its standard level (e.g., 0V). In at least one embodiment, unelected plate-lines (e.g., PL0, PL2, . . . PLm) and unselected word-lines (e.g., WL0, WL2, . . . WLm) remain at 0V. In at least one embodiment, there is no time gap between time points t0 to t1 and between time point t2 to time point t3.

Figure 14B:
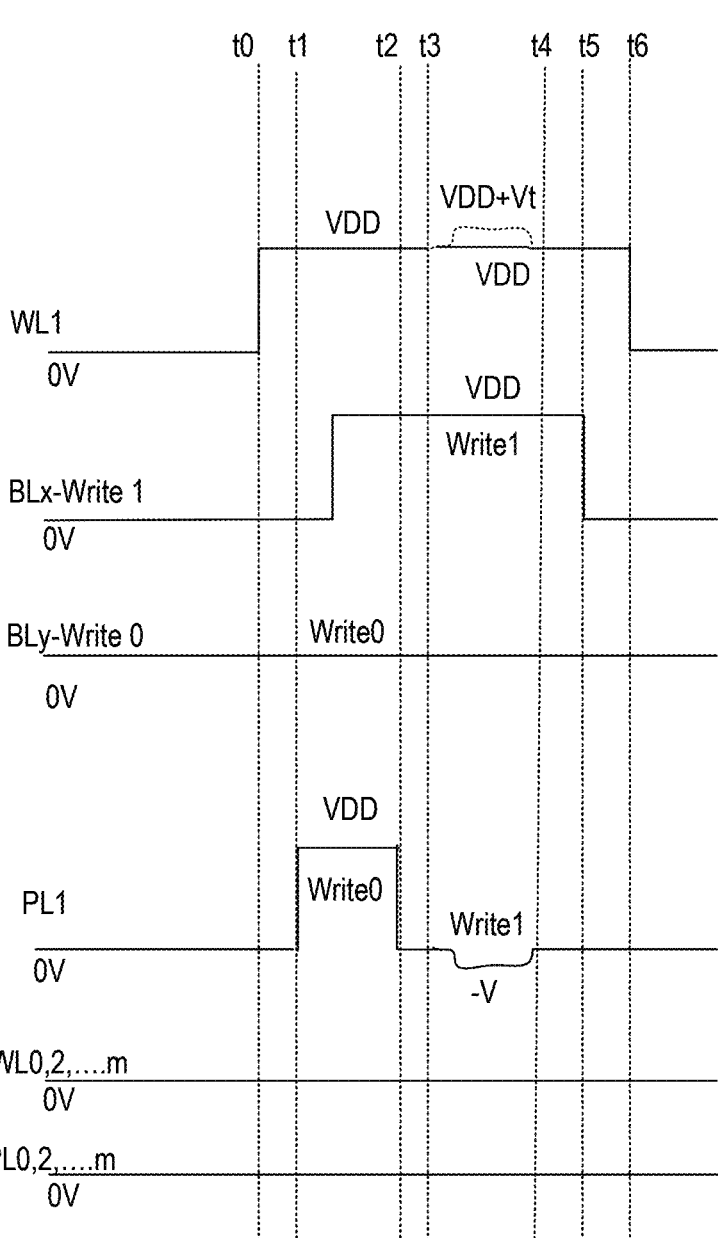
FIG. 14B illustrates a timing diagram of 2-phase write 1 operation with negatively boosted PL for a 1T1C bit-cell with PL parallel to WL, and where voltage on PL asserts before voltage on BL asserts, in accordance with at least one embodiment.

FIG. 14B illustrates timing diagram 1420 of 2-phase write 1 operation with negatively boosted PL for a 1T1C bit-cell with PL parallel to WL, and where voltage on PL asserts before voltage on BL asserts, in accordance with at least one embodiment. Timing diagram 1420 is similar to timing diagram 1400 but for relative timing of plate-line (e.g., PL1) and write bit-line (e.g., BLx_Write1). In at least one embodiment, race condition is avoided by asserting voltage on a plate-line before voltage on bit-line is asserted (e.g., voltage on PL1 is asserted to VDD before BLx_Write 1 is asserted to VDD).

Figure 15:
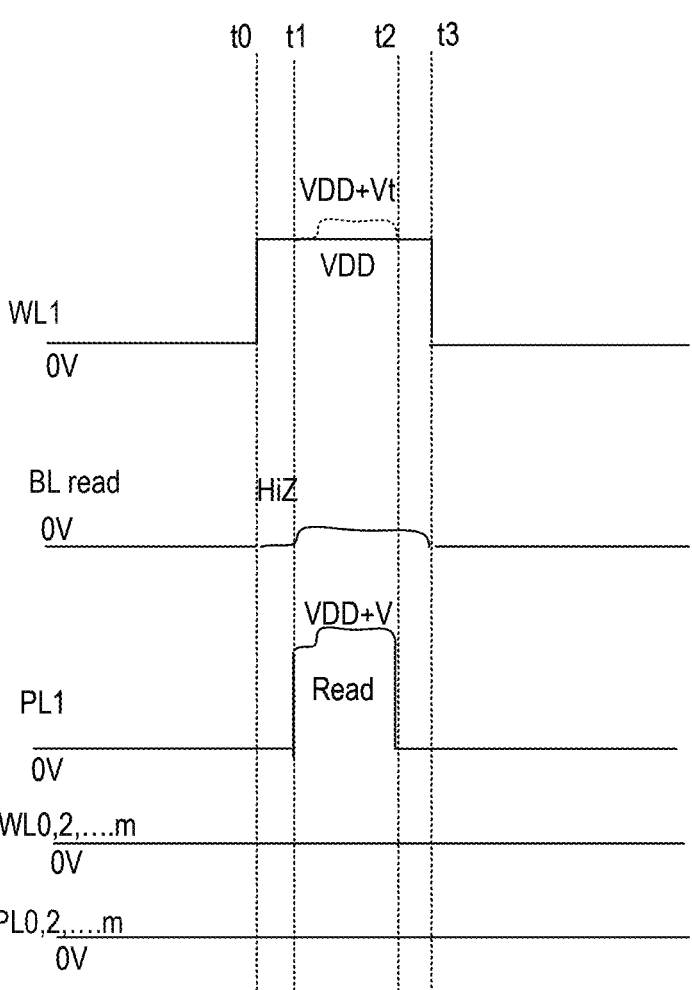
FIG. 15 illustrates a timing diagram of a read operation with positively boosted PL for a 1T1C bit-cell with PL parallel to WL, in accordance with at least one embodiment.

FIG. 15 illustrates timing diagram 1500 read operation with positively boosted PL for a 1T1C bit-cell with PL parallel to WL, in accordance with at least one embodiment. In at least one embodiment, signal on PL is positively boosted for a 1T1C bit-cell where PL is parallel to bit-line (BL). In at least one embodiment, during read operation, PL boosting circuitry boosts to VDD+V to give larger BL signal for better sensing of BL. In at least one embodiment, a boosting circuitry can boost voltage on selected WL (e.g., WL1) to give additional voltage drop across capacitor of selected 1T1C bit-cell. In at least one embodiment, during read operation or during write 0 operation, PL boosting circuit positively boots selected PL (e.g., PL1) to VDD+V, where +V is the boosted level. In at least one embodiment, to perform read operation, WL driver of logic 724 asserts selected WL to VDD. In at least one embodiment, to perform read operation, WL driver of logic 724 asserts selected WL to positively boosted level VDD+Vt, where Vt is a threshold voltage of selected transistor of 1T1C bit-cell. In at least one embodiment, boosting circuitry boosts selected WL during an entire period selected WL is asserted (e.g., from time point t0 to time point t3). In at least one embodiment, boosting circuitry boosts selected WL for a period where selected BL is no longer in high impedance state (HiZ) (e.g., at time point t1) and selected PL positive boosting ends (e.g., at time point t2). In at least one embodiment, BL is floated or set to high impedance before boosting circuitry positively boots selected PL for read operation. In at least one embodiment, change develops on BL based on charge or logic value of selected bit-cell. This charge is then sensed by a sense amplifier (not shown). In at least one embodiment, unselected word-lines (e.g., WL0, WL2, . . . WLm) and plate-lines (e.g., PL0, PL2, . . . PLm) are set to 0V.

Figure 16:
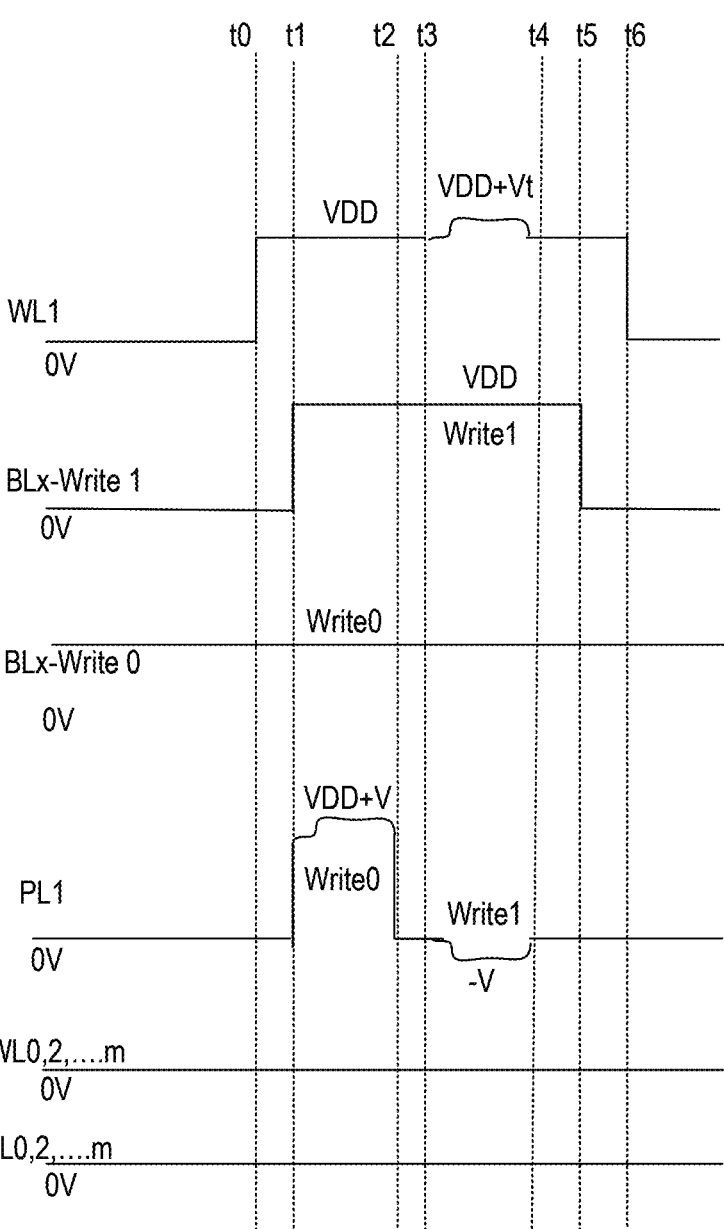
FIG. 16 illustrates a timing diagram of a 2-phase write 1 operation with negatively boosted PL for a 1T1C bit-cell with PL parallel to WL, and with positively boosted word-line, in accordance with at least one embodiment.

FIG. 16 illustrates timing diagram 1600 of a 2-phase write 1 operation with negatively boosted PL for a 1T1C bit-cell with PL parallel to WL, and with positively boosted word-line, in accordance with at least one embodiment. Timing diagram 1600 is similar to timing diagram 1400 but for PL boosting circuitry positively boosting selected PL to VDD+V during write 0 operation (e.g., between timing points t1 and t2).

Table 4 summarizes bit-cell voltages for memory array when PL is parallel to WL.

insulative material 1953 (also referred to as tunnel barrier) includes one of: MgO, AlOx (where x is a number or fraction), or $SrTiO_3$. In at least one embodiment, fixed ferromagnetic layer 1954 includes one of $CrO_2$, Heusler alloys, FeCo(001), CoFeB. In at least one embodiment, an anti-ferromagnetic layer (not shown) is formed over fixed ferromagnetic layer 1954. In at least one embodiment, anti-ferromagnetic (AFM) layer comprises Ru or Ir. In at least one embodiment, AFM layer comprises a super lattice of Co and Pt coupled with Ru or Ir. In at least one embodiment, bottom electrode 1951 and top electrode 1955 includes one or more of: Al, Ti, Cu, Ag, Pt, TiN, TaN, Al doped ZnO, Ga-doped ZnO, or indium tin oxide (ITO). In at least one embodiment, bottom electrode 1951 and top electrode 1955 are symmetric. In at least one embodiment, bottom electrode 1951 and top electrode 1955 are asymmetric. In at least one embodiment, bottom electrode 1951 and top electrode 1955 may have same materials as those discussed with reference to electrodes in FIG. 4B.

In at least one embodiment, resistive memory 1960 (Re-RAM) comprises bottom electrode 1961, insulative material 1962, and top electrode 1963. In at least one embodiment, insulative material 1962 includes: $HfO_x$, $TiO_x$, TaOx, NiO, $ZnO_x$, $Zn_2TiO_4$, $KnO_x$, MgO, $AlO_x$, $ZrO_x$, $Cu_xO_y$, $SnO_2$, $GeO_x$, $LaO_x$, $YO_x$, $MoO_x$, or $CoO_x$ (where 'x' and 'y' are a number or a fraction). In at least one embodiment, insulative material 1962 for ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In at least one embodiment, bottom electrode 1961 and top electrode 1963 includes one or more of: Al, Ti, Cu, Ag, Pt, TiN, TaN, Al doped ZnO, Ga-doped ZnO, or indium tin oxide (ITO). In at least one embodiment, bottom electrode 1961 and top electrode 1963 are symmetric. In at least one embodiment, bottom electrode 1961 and top electrode 1963 are asymmetric. In at least one embodiment, bottom electrode 1961 and top electrode 1963 may have same materials as those discussed with reference to electrodes in FIG. 4B.

TABLE 4

|  |  | PL | WL | BL | SN | VBL − bulk | VSN − bulk | \|VFE\| |
|---|---|---|---|---|---|---|---|---|
| Write 1 | Selected row | −Vplbst | VDD + Vwlbst | VDD | (VDD − Vt + Vwlbst)* | VDD | VDD − Vt + Vwlbst | VDD − Vt + Vwlbst + Vplbst |
|  | Unselected row | 0 | 0 | VDD | 0 | VDD | 0 | 0 |
| Write 0 | Selected Row | VDD + Vplbst | VDD + Vwlbst | 0 | 0 | 0 | 0 | VDD + Vplbst |
| or Read | Unselected row | 0 | 0 | 0 | 0 | 0 | 0 | 0 |

Figure 19:
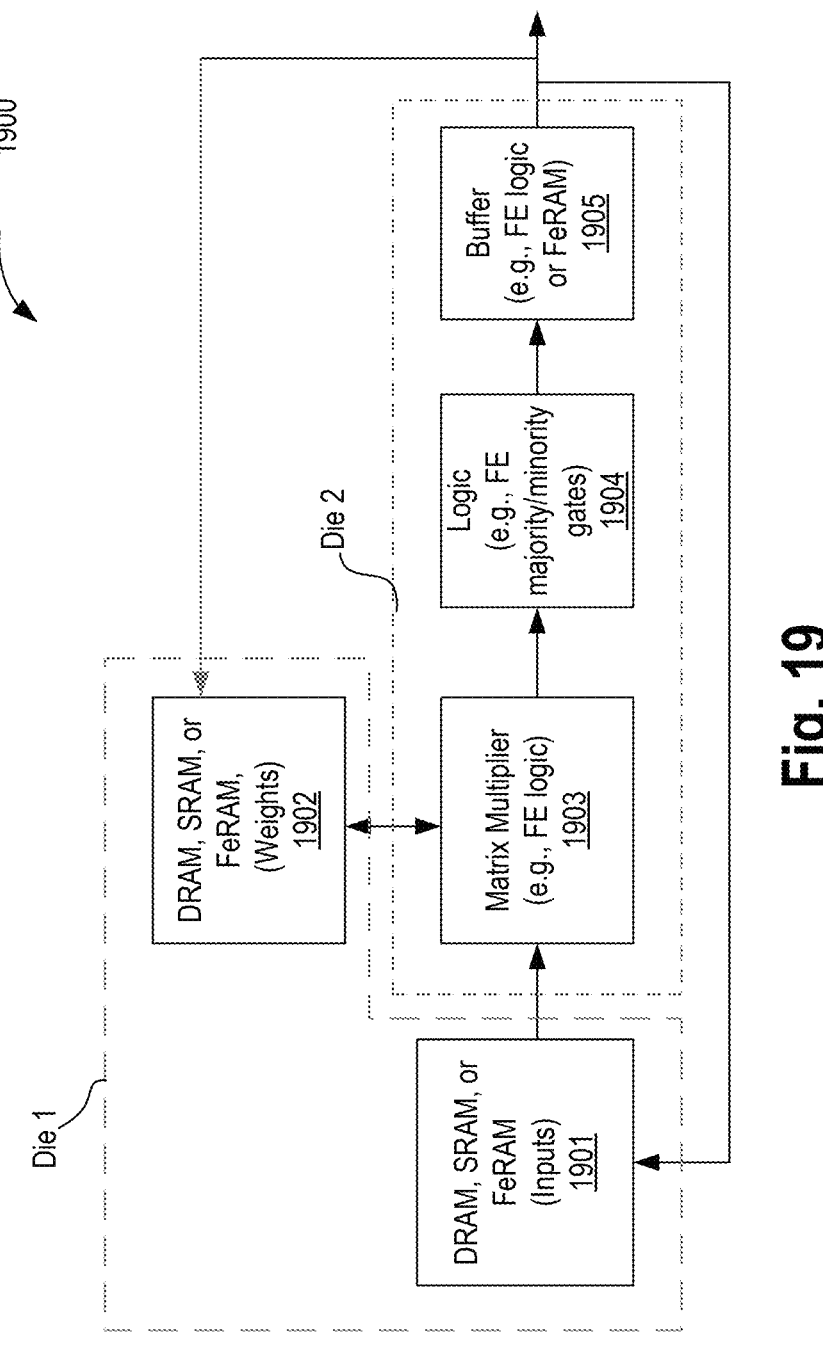
FIG. 19 illustrates an architecture of a computational block comprising a compute die stacked with a memory die, wherein the memory die includes memory arrays having bit-cells that are written and/or read using PL boosting scheme, in accordance with at least one embodiment.

FIG. 19 illustrates memory elements (MEs) for use in memory bit-cells, in accordance with at least one embodiment. In at least one embodiment, planar memory element structures are resistive elements. In at least one embodiment, planar memory element structures are magnetic tunnel junctions (MTJs). In at least one embodiment, planar memory element structures are phase change memory (PCM) memories.

In at least one embodiment, MTJ 1900 comprises a bottom electrode 1951, free ferromagnetic layer 1952, insulative material 1953 (e.g., tunnel barrier materials such as MgO, $Al_2O_3$, or $SrTiO_3$), fixed ferromagnetic layer 1954, and top electrode 1955. In at least one embodiment, free ferromagnetic layer 1952 comprises one or more of CrO2, Heusler alloys, Fe, or CoFeB. In at least one embodiment, In at least one embodiment, in ReRAM systems that use forming of filaments, an initial operation may begin by applying a voltage pulse with an increasing magnitude, between top electrode 1963 and bottom electrode 1961. In at least one embodiment, magnitude of voltage pulse may be substantially greater than a voltage level utilized to cycle ReRAM device during regular course of programming. In at least one embodiment, a high voltage pulse may be utilized to perform an intentional one-time breakdown process, known as forming. In at least one embodiment, forming process creates one or more conductive filaments that provide pathways for electron transport during device operation.

In at least one embodiment, resistive memory 1960 is a phase-change memory (PC-RAM). In at least one embodiment, resistive memory 1960 comprises bottom electrode 1961, insulative material 1962, and top electrode 1963. In at least one embodiment, insulative material 1962 is a phase-change material. In at least one embodiment, phase-change material comprises phase-change chalcogenides. In at least one embodiment, phase-change material includes one of: $(GeTe)m(Sb_2Te_3)n$, $Ge_2Sb_2Te_5$, $Ge_2Sb_2Te_4$, AgInSbTe, super lattices of GeTe, $Sb_2Te_3$, super lattices of $TiTe_2$ and $Sb_2Te_3$, $WSe_2$, $WS_2$, or $PtSe_2$ (where m and n are numbers or fractions). In at least one embodiment, phase-change material includes binary transition metal oxides such as NiO or $TiO_2$, perovskites such as $Sr(Zr)TiO_3$ or PCMO, solid-state electrolytes such as GeS, GeSe, $SiO_x$, or $Cu_2S$, organic materials such as A1DCN, or layered materials, such as hexagonal boron nitride.

In at least one embodiment, when ME structures are not capacitors (as those described with reference to at least one embodiment herein), current based pulsing scheme(s) are used to drive (e.g., write) and for sensing (e.g., read). In at least one embodiment, plate-lines flow current to configure or read ME structures. In at least one embodiment, ME structures may be a mix of various types of ME structures (e.g., ferroelectric based capacitors, paraelectric based capacitors, MTJ, ReRAM, or PC-RAM). In at least one embodiment, all ME structures for an array are of same type.

Figure 18:
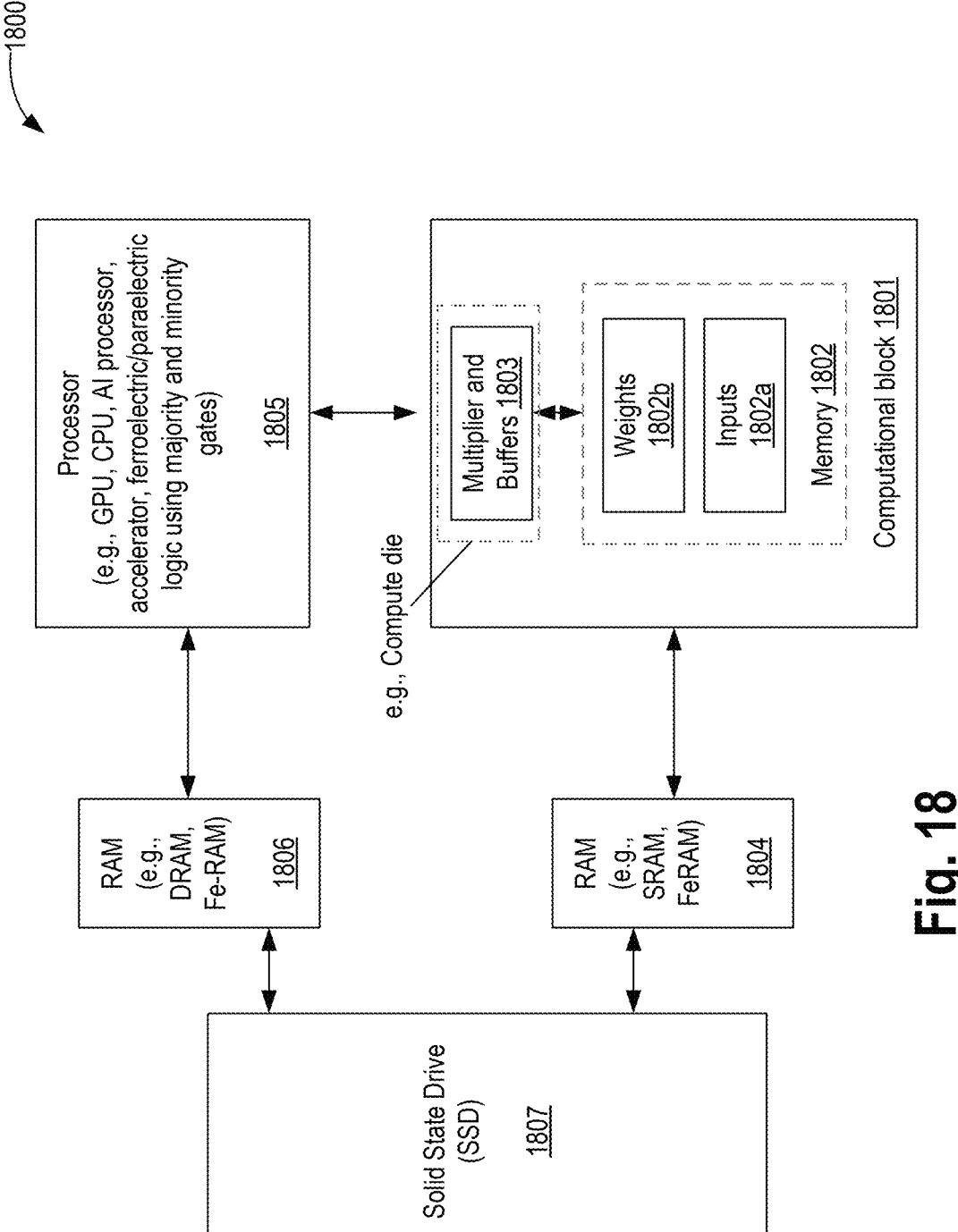
FIG. 18 illustrates a high-level architecture of an artificial intelligence (AI) machine comprising a compute die stacked over a memory die, where the memory die includes memory arrays that are written and/or read using PL boosting scheme, in accordance with at least one embodiment.

FIG. 18 illustrates a high-level architecture of an artificial intelligence (AI) machine comprising a compute die stacked over a memory die, where the memory die includes memory arrays that are written and/or read using PL boosting scheme, in accordance with at least one embodiment.

In at least one embodiment, Al machine 1800 comprises computational block 1801 or processor having random-access memory (RAM) 1802 and multiplier and buffers 1803; first random-access memory 1804 (e.g., static RAM (SRAM), ferroelectric or paraelectric RAM (FeRAM), ferroelectric or paraelectric static random-access memory (FeSRAM)), main processor 1805, second random-access memory 1806 (dynamic RAM (DRAM), FeRAM), and solid-state memory or drive (SSD) 1807. In at least one embodiment, some or all components of Al machine 1800 are packaged in a single package forming a system-on-chip (SoC). In at least one embodiment, SoC can be configured as a logic-on-logic configuration, which can be in a 3D configuration or a 2.5D configuration.

In at least one embodiment, computational block 1801 is packaged in a single package and then coupled to processor 1805 and memories 1804, 1806, and 1807 on a printed circuit board (PCB). In at least one embodiment, computational block 1801 is configured as a logic-on-logic configuration, which can be in a 3D configuration or a 2.5D configuration. In at least one embodiment, computational block 1801 comprises a special purpose compute die 1803 or microprocessor. In at least one embodiment, compute die 1803 is a compute chiplet that performs a function of an accelerator or inference. In at least one embodiment, memory 1802 is DRAM which forms a special memory/cache for special purpose compute die 1803. In at least one embodiment, DRAM can be embedded DRAM (eDRAM) such as 1T1C (one transistor and one capacitor) based memories. In at least one embodiment, RAM 1802 is ferroelectric or paraelectric RAM (Fe-RAM).

In at least one embodiment, compute die 1803 is specialized for applications such as Artificial Intelligence, graph processing, and algorithms for data processing. In at least one embodiment, compute die 1803 further has logic computational blocks, for multipliers and buffers, a special data memory block (e.g., buffers) comprising DRAM, FeRAM, or a combination of them. In at least one embodiment, RAM 1802 has weights and inputs stored to improve computational efficiency. In at least one embodiment, interconnects between processor 1805 (also referred to as special purpose processor), first RAM 1804, and compute die 1803 are optimized for high bandwidth and low latency. In at least one embodiment, architecture of FIG. 18 allows efficient packaging to lower energy, power, or cost, and provides for ultra-high bandwidth between RAM 1804 and compute chiplet 1803 of computational block 1801.

In at least one embodiment, RAM 1802 is partitioned to store input data (or data to be processed) 1802a and weight factors 1802b. In at least one embodiment, input data 1802a is stored in a separate memory (e.g., separate memory die) and weight factors 1802b are stored in a separate memory (e.g., separate memory die).

In at least one embodiment, computational logic or compute chiplet 1803 comprises matrix multiplier, adder, concatenation logic, buffers, and combinational logic. In at least one embodiment, compute chiplet 1803 performs multiplication operation on inputs 1802a and weights 1802b. In at least one embodiment, weights 1802b are fixed weights. In at least one embodiment, processor 1805 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 1802. In at least one embodiment, input data that is to be analyzed using a trained model is processed by computational block 1801 with computed weights 1802b to generate an output (e.g., a classification result).

In at least one embodiment, first RAM 1804 is ferroelectric or paraelectric based SRAM. For example, a six transistor (6T) SRAM bit-cell having ferroelectric or paraelectric transistors are used to implement a non-volatile FeSRAM. In at least one embodiment, SSD 1807 comprises NAND flash cells. In at least one embodiment, SSD 1807 comprises NOR flash cells. In at least one embodiment, SSD 1807 comprises multi-threshold NAND flash cells.

In at least one embodiment, non-volatility of FeRAM is used to introduce new features such as security, functional safety, and faster reboot time of Al machine 1800. In at least one embodiment, non-volatile FeRAM is a low power RAM that provides fast access to data and weights. FeRAM 1804 can also serve as fast storage for computational block 1801 (which can be an inference die or an accelerator), which typically has low capacity and fast access requirements.

In at least one embodiment, FeRAM (FeDRAM or FeSRAM) includes ferroelectric or paraelectric material. In at least one embodiment, ferroelectric or paraelectric material may be in a transistor gate stack or in a capacitor of memory. In at least one embodiment, ferroelectric material can be any suitable low voltage FE material discussed herein. While at least one embodiment here is described with reference to ferroelectric material, at least one embodiment is applicable to any of nonlinear polar materials described herein.

Figure 17:
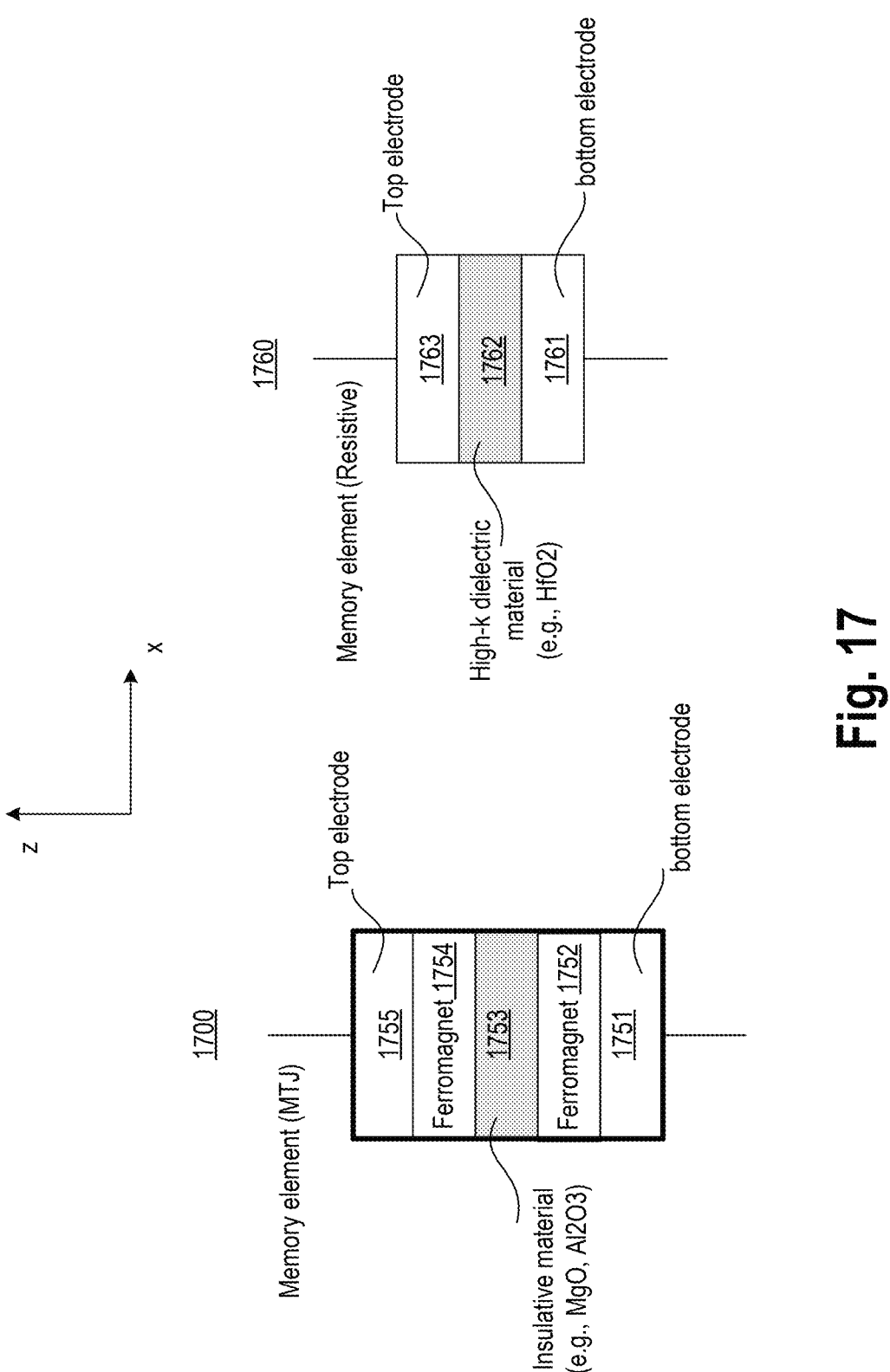
FIG. 17 illustrates memory elements (MEs) for use in memory bit-cells, in accordance with at least one embodiment.

FIG. 17 illustrates an architecture of a computational block comprising a compute die stacked with a memory die, wherein the memory die includes memory arrays having bit-cells that are written and/or read using PL boosting scheme, in accordance with at least one embodiment.

In at least one embodiment, architecture of FIG. 17 illustrates an architecture for a special purpose compute die where RAM memory buffers for inputs and weights are split on die-1 and logic and optional memory buffers are split on die-2.

In at least one embodiment, memory die (e.g., Die 1) is positioned below compute die (e.g., Die 2) such that a heat sink or thermal solution is adjacent to compute die. In at least one embodiment, memory die is embedded in an interposer. In at least one embodiment, memory die behaves as an interposer in addition to its basic memory function. In at least one embodiment, memory die is a high bandwidth memory (HBM) which comprises multiple dies of memories in a stack and a controller to control read and write functions to stack of memory dies. In at least one embodiment, memory die comprises a first die to store input data and a second die to store weight factors. In at least one embodiment, memory die is a single die that is partitioned such that first partition 1701 of memory die is used to store input data and second partition 1702 of memory die is used to store weights. In at least one embodiment, memory die comprises DRAM. In at least one embodiment, memory die comprises FE-SRAM or FE-DRAM. In at least one embodiment, memory die comprises MRAM. In at least one embodiment, memory die comprises SRAM. In at least one embodiment, memory partitions 1701 and 1702, or memory dies 1701 and 1702 include one or more of: DRAM, FE-SRAM, FE-DRAM, SRAM, and/or MRAM. In at least one embodiment, input data stored in memory partition or die 1701 is data to be analyzed by a trained model with fixed weights stored in memory partition or die 1702.

In at least one embodiment, compute die comprises ferroelectric or paraelectric logic (e.g., majority, minority, and/or threshold gates) to implement matrix multiplier 1703, logic 1704, and temporary buffer 1705. In at least one embodiment, matrix multiplier 1703 performs multiplication operation on input data 'X' and weights 'W' to generate an output 'Y'. In at least one embodiment, this output may be further processed by logic 1704. In at least one embodiment, logic 1704 performs a threshold operation, pooling and drop out operations, and/or concatenation operations to complete AI logic primitive functions.

In at least one embodiment, output of logic 1704 (e.g., processed output 'Y') is temporarily stored in buffer 1705. In at least one embodiment, buffer 1705 is memory such as one or more of: DRAM, Fe-SRAM, Fe-DRAM, MRAM, resistive RAM (Re-RAM) and/or SRAM. In at least one embodiment, buffer 1705 is part of memory die (e.g., Die 1). In at least one embodiment, buffer 1705 performs function of a re-timer. In at least one embodiment, output of buffer 1705 (e.g., processed output 'Y') is used to modify weights in memory partition or die 1702. In at least one embodiment, architecture 1700 not only operates as an inference circuitry, but also as a training circuitry to train a model. In at least one embodiment, matrix multiplier 1703 includes an array of multiplier cells, wherein first partition 1701 (e.g., DRAMs) and second partition 1702 (e.g., DRAMs) include arrays of memory bit-cells, respectively, wherein each multiplier cell is coupled to a corresponding memory bit-cell of first partition 1701 (e.g., DRAMs) and second partition 1702 (e.g., DRAMs). In at least one embodiment, architecture 1700 comprises an interconnect fabric coupled to array of multiplier cells such that each multiplier cell is coupled to interconnect fabric.

In at least one embodiment, architecture 1700 provides reduced memory access for compute die (e.g., die 2) by providing data locality for weights, inputs, and outputs. In at least one embodiment, data from and to AI computational blocks (e.g., matrix multiplier 1703) is locally processed within a same packaging unit. In at least one embodiment, architecture 1700 also segregates memory and logic operations onto a memory die (e.g., Die 1) and a logic die (e.g., Die 2), respectively, allowing for optimized AI processing. In at least one embodiment, desegregated dies allow for improved yield of dies. In at least one embodiment, a high-capacity memory process for Die 1 allows reduction of power of external interconnects to memory, reduces cost of integration, and results in a smaller footprint.

Figure 20:
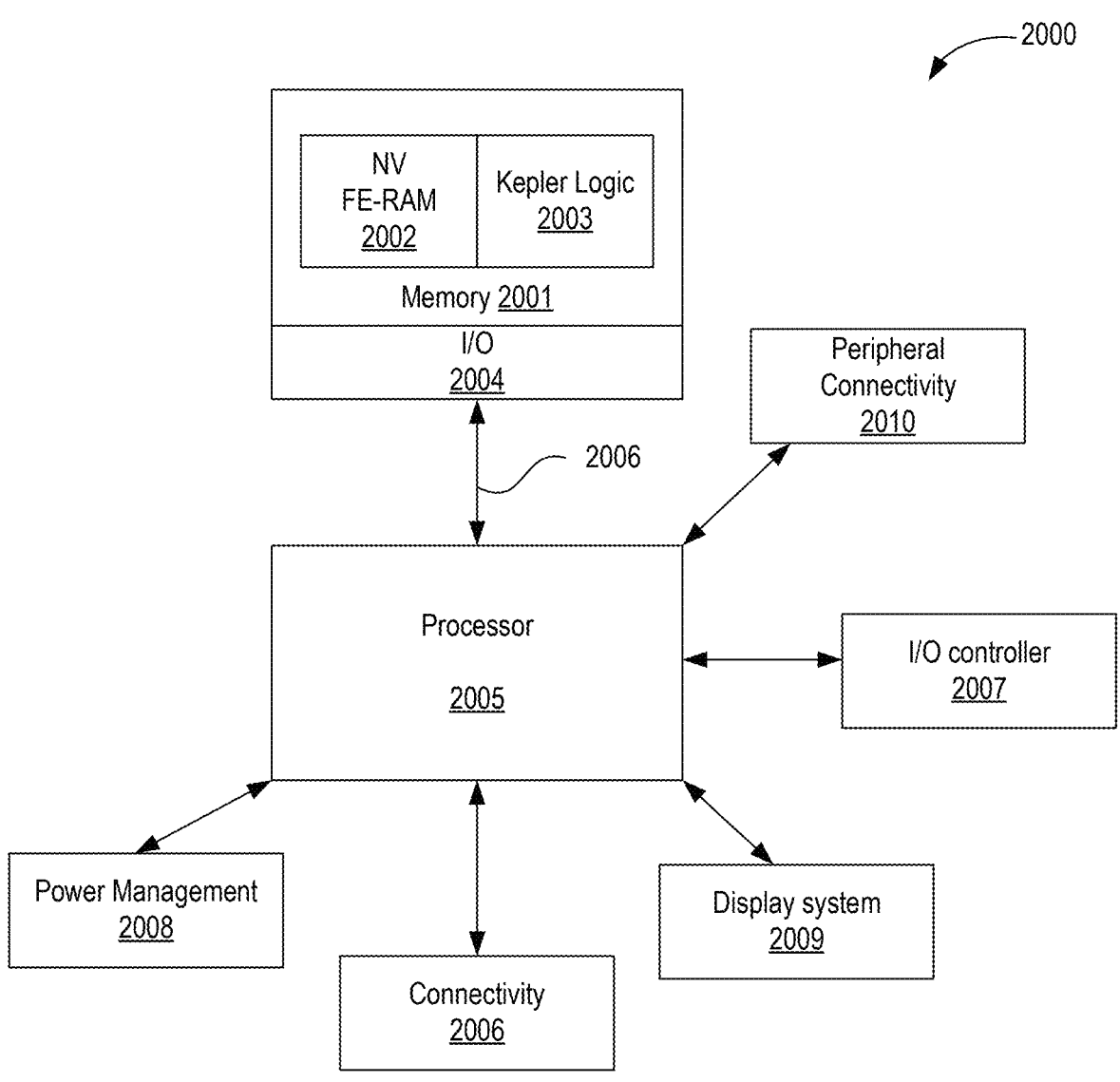
FIG. 20 illustrates a system-on-chip (SOC) that uses memory arrays including memory arrays having bit-cells that are written and/or read using PL boosting scheme, in accordance with at least one embodiment.

FIG. 20 illustrates a system-on-chip (SOC) that uses memory arrays including memory arrays having bit-cells that are written and/or read using PL boosting scheme, in accordance with at least one embodiment.

In at least one embodiment, SoC 2000 comprises memory 2001 having static random-access memory (SRAM) or FE based random-access memory FE-RAM, or any other suitable memory. In at least one embodiment, memory can be non-volatile (NV) or volatile memory. In at least one embodiment, memory 2001 may also comprise logic 2003 to control memory 2002. In at least one embodiment, write and read drivers are part of logic 2003. In at least one embodiment, these drivers and other logic are implemented using majority or threshold gates discussed herein. In at least one embodiment, logic 2003 can comprise majority or threshold gates and traditional logic (e.g., CMOS based NAND, NOR etc.).

In at least one embodiment, SoC further comprises a memory I/O (input-output) interface 2004. In at least one embodiment, interface may be a double-data rate (DDR) compliant interface or any other suitable interface to communicate with a processor. In at least one embodiment, processor 2005 of SoC 2000 can be a single core or multiple core processor. In at least one embodiment, processor 2005 can be a general-purpose processor (CPU), a digital signal processor (DSP), or an Application Specific Integrated Circuit (ASIC) processor. In at least one embodiment, processor 2005 is an artificial intelligence (AI) processor (e.g., a dedicated AI processor, a graphics processor configured as an AI processor). In at least one embodiment, processor 2005 executes instructions that are stored in memory 2001.

In at least one embodiment, AI is a broad area of hardware and software computations where data is analyzed, classified, and then a decision is made regarding data. In at least one embodiment, a model describing classification of data for a certain property or properties is trained over time with large amounts of data. In at least one embodiment, process of training a model requires large amounts of data and processing power to analyze data. In at least one embodiment, when a model is trained, weights or weight factors are modified based on outputs of model. In at least one embodiment, once weights for a model are computed to a high confidence level (e.g., 95% or more) by repeatedly analyzing data and modifying weights to get expected results, model is deemed "trained." In at least one embodiment, trained model with fixed weights is then used to make decisions about new data. In at least one embodiment, training a model and then applying trained model for new data is hardware intensive activity. In at least one embodiment, AI processor has reduced latency of computing training model and using training model, which reduces power consumption of such AI processor systems.

In at least one embodiment, processor 2005 may be coupled to number of other chiplets that can be on same die as SoC 2000 or on separate dies. In at least one embodiment, these chiplets include connectivity circuitry 2006, I/O controller 2007, power management 2008, display system 2009, and connectivity circuitry 2006 (e.g., peripheral connectivity).

In at least one embodiment, connectivity circuitry 2006 represents hardware devices and software components for communicating with other devices. In at least one embodiment, connectivity circuitry 2006 may support various connectivity circuitries and standards. In at least one embodiment, connectivity circuitry 2006 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one embodiment, connectivity circuitry 2006 may support non-cellular standards such as WiFi.

In at least one embodiment, I/O controller 2007 represents hardware devices and software components related to interaction with a user. In at least one embodiment, I/O controller 2007 is operable to manage hardware that is part of an audio subsystem and/or display subsystem. In at least one embodiment, input through a microphone or other audio device can provide input or commands for one or more applications or functions of SoC 2000. In at least one embodiment, I/O controller 2007 illustrates a connection point for additional devices that connect to SoC 2000 through which a user might interact with system. In at least one embodiment, devices that can be attached to SoC 2000 might include microphone devices, speaker or stereo systems, video systems or other display devices, keyboard or keypad devices, or other I/O devices for use with specific applications such as card readers or other devices.

In at least one embodiment, power management 2008 represents hardware or software that performs power management operations, e.g., based at least in part on receiving measurements from power measurement circuitries, temperature measurement circuitries, charge level of battery, and/or any other appropriate information that may be used for power management. In at least one embodiment, by using majority and threshold gates discussed herein, non-volatility is achieved at output of this logic. In at least one embodiment, power management 2008 may accordingly put such logic into low power state without worry of losing data. In at least one embodiment, power management may select a power state according to Advanced Configuration and Power Interface (ACPI) specification for one or all components of SoC 2000.

In at least one embodiment, display system 2009 represents hardware (e.g., display devices) and software (e.g., drivers) components that provide a visual and/or tactile display for a user to interact with processor 2005. In at least one embodiment, display system 2009 includes a touch screen (or touch pad) device that provides both output and input to a user. In at least one embodiment, display system 2009 may include a display interface, which includes particular screen or hardware device used to provide a display to a user. In at least one embodiment, display interface includes logic separate from processor 2005 to perform at least some processing related to display.

In at least one embodiment, peripheral connectivity 2010 may represent hardware devices and/or software devices for connecting to peripheral devices such as printers, chargers, cameras, etc. In at least one embodiment, peripheral connectivity 2010 may support communication protocols, e.g., PCIe (Peripheral Component Interconnect Express), USB (Universal Serial Bus), Thunderbolt, High-Definition Multimedia Interface (HDMI), Firewire, etc.

In at least one embodiment, SoC 2000 includes a coherent cache or memory-side buffer chiplet (not shown) which includes ferroelectric or paraelectric memory. In at least one embodiment, coherent cache, or memory-side buffer chiplet can be coupled to processor 2005 and/or memory 2001 as described herein (e.g., via silicon bridge or vertical stacking).

Here, "device" may generally refer to an apparatus according to context of usage of that term. In at least one embodiment, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one embodiment, plane of a device may also be plane of an apparatus, which comprises the device.

Throughout specification, and in claims, "connected" may generally refer to a direct connection, such as electrical, mechanical, or magnetic connection between things that are connected, without any intermediary devices.

Here, "coupled" may generally refer to a direct or indirect connection, such as a direct electrical, mechanical, or magnetic connection between things that are connected or an indirect connection, through one or more passive or active intermediary devices.

Here, "adjacent" may generally refer to a position of a thing being next to (e.g., immediately next to or close to with one or more things between them) or adjoining another thing (e.g., abutting it).

Here, "circuit" or "module" may generally refer to one or more passive and/or active components that are arranged to cooperate with one another to provide a desired function.

Here, "signal" may generally refer to at least one current signal, voltage signal, magnetic signal, or data/clock signal. Here, meaning of "a," "an," and "the" include plural references. Here, meaning of "in" includes "in" and "on."

Here, "analog signal" generally refers to any continuous signal for which time varying feature (variable) of signal is a representation of some other time varying quantity, e.g., analogous to another time varying signal.

Here, "digital signal" may generally refer to a physical signal that is a representation of a sequence of discrete values (a quantified discrete-time signal), for example of an arbitrary bit stream, or of a digitized (sampled and analog-to-digital converted) analog signal.

Here, "scaling" may generally refer to converting a design (schematic and layout) from one process technology to another process technology and subsequently being reduced in layout area. Here, "scaling" may generally refer to downsizing layout and devices within same technology node. Here, "scaling" may also generally refer to adjusting (e.g., slowing down or speeding up—e.g., scaling down, or scaling up respectively) of a signal frequency relative to another parameter, for example, power supply level.

Here, terms "substantially," "close," "approximately," "near," and "about," generally refer to being within +/−10% of a target value. For example, unless otherwise specified in explicit context of their use, terms "substantially equal,"

"about equal" and "approximately equal" mean that there is no more than incidental variation between things so described. In at least one embodiment, such variation is no more than +/−10% of a predetermined target value.

Unless otherwise specified use of ordinal adjectives "first," "second," and "third," etc., to describe a common object, merely indicate that different instances of like objects are being referred to and are not intended to imply that objects so described must be in a given sequence, either temporally, spatially, in ranking or in any other manner.

For purposes of present disclosure, phrases "A and/or B" and "A or B" mean (A), (B), or (A and B). In at least one embodiment, phrase "A, B, and/or C" means (A), (B), (C), (A and B), (A and C), (B and C), or (A, B and C).

Here, "left," "right," "front," "back," "top," "bottom," "over," "under," and like in description and in claims, if any, are used for descriptive purposes and not necessarily for describing permanent relative positions. In at least one embodiment, "over," "under," "front side," "back side," "top," "bottom," "over," "under," and "on" as used herein refer to a relative position of one component, structure, or material with respect to other referenced components, structures, or materials within a device, where such physical relationships are noteworthy. In at least one embodiment, these terms are employed herein for descriptive purposes only and predominantly within context of a device z-axis and therefore may be relative to an orientation of a device. In at least one embodiment, a first material "over" a second material in context of a figure provided herein may also be "under" second material if device is oriented upside-down relative to context of figure provided. In context of materials, one material disposed over or under another may be directly in contact or may have one or more intervening materials. Moreover, one material disposed between two materials may be directly in contact with two layers or may have one or more intervening layers. In at least one embodiment, a first material "on" a second material is in direct contact with that second material. Similar distinctions are to be made in context of component assemblies.

Here, "between" may be employed in context of z-axis, x-axis or y-axis of a device. In at least one embodiment, a material that is between two other materials may be in contact with one or both of those materials, or it may be separated from both of other two materials by one or more intervening materials. In at least one embodiment, a material "between" two other materials may therefore be in contact with either of other two materials, or it may be coupled to other two materials through an intervening material. In at least one embodiment, a device that is between two other devices may be directly connected to one or both of those devices, or it may be separated from both of other two devices by one or more intervening devices.

Here, multiple non-silicon semiconductor material layers may be stacked within a single fin structure. In at least one embodiment, multiple non-silicon semiconductor material layers may include one or more "P-type" layers that are suitable (e.g., offer higher hole mobility than silicon) for P-type transistors. In at least one embodiment, multiple non-silicon semiconductor material layers may further include one or more "N-type" layers that are suitable (e.g., offer higher electron mobility than silicon) for N-type transistors. In at least one embodiment, multiple non-silicon semiconductor material layers may further include one or more intervening layers separating N-type from P-type layers. In at least one embodiment, intervening layers may be at least partially sacrificial, for example, to allow one or more of a gate, a source, or a drain to wrap completely around a channel region of one or more of N-type and P-type transistors. In at least one embodiment, multiple non-silicon semiconductor material layers may be fabricated, at least in part, with self-aligned techniques such that a stacked CMOS device may include both a high-mobility N-type and P-type transistor with a footprint of a single FET (field effect transistor).

Here, "backend" or back-end-of-line (BOEL) may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of backend of die. Here, "frontend" may generally refer to a section of die that includes active region (e.g., where transistors are fabricated) and low-level metal layers and corresponding vias that are closer to active region (e.g., metal layer 5 and below in ten-metal stack die, for example).

Reference in specification to "an embodiment," "one embodiment," "in at least one embodiment," "some embodiments," or "other embodiments" means that a particular feature, structure, or characteristic described in connection with embodiments is included in at least some embodiments, but not necessarily all embodiments. Various appearances of "an embodiment," "one embodiment," "in at least one embodiment," or "some embodiments" are not necessarily all referring to same embodiments. If specification states a component, feature, structure, or characteristic "may," "might," or "could" be included, that particular component, feature, structure, or characteristic is not required to be included. If specification or claim refers to "a" or "an" element, that does not mean there is only one element. If specification or claims refer to "an additional" element, that does not preclude there being more than one additional elements.

Furthermore, particular features, structures, functions, or characteristics may be combined in any suitable manner in one or more embodiments. For example, a first embodiment may be combined with a second embodiment anywhere particular features, structures, functions, or characteristics associated with two embodiments are not mutually exclusive.

While at least one embodiment has been described in conjunction with specific embodiments thereof, many alternatives, modifications, and variations of such embodiments will be apparent to those of ordinary skill in art in light of foregoing description. At least one embodiment is intended to embrace all such alternatives, modifications, and variations as to fall within broad scope of appended claims.

In addition, well-known power/ground connections to integrated circuit (IC) chips and other components may or may not be shown within presented figures, for simplicity of illustration and discussion, and so as not to obscure any embodiment. Further, arrangements may be shown in block diagram form to avoid obscuring any embodiment, and also in view of fact that specifics with respect to implementation of such block diagram arrangements are highly dependent upon platform within which an embodiment is to be implemented (e.g., such specifics should be well within purview of one skilled in art). Where specific details (e.g., circuits) are set forth to describe example embodiments of disclosure, it should be apparent to one skilled in art that disclosure can be practiced without, or with variation of, these specific details. Description of an embodiment is thus to be regarded as illustrative instead of limiting.

In at least one embodiment, structures described herein can also be described as method(s) of forming those structures or apparatuses, and method(s) of operation of these structures or apparatuses. Following examples are provided that illustrate at least one embodiment. An example can be combined with any other example. As such, at least one embodiment can be combined with at least another embodiment without changing scope of an embodiment.

Example 1 is an apparatus comprising: one or more circuitries to adjust a voltage on a plate-line to be above or below a nominal voltage of the plate-line based on a write operation or read operation on a bit-cell, wherein the bit-cell comprises: a transistor; and a capacitor including non-linear polar material, wherein the capacitor has a first terminal coupled to the plate-line and a second terminal coupled to the transistor.

Example 2 is an apparatus according to any example herein, in particular example 1, wherein the nominal voltage is a supply voltage in a write 1 operation.

Example 3 is an apparatus according to any example herein, in particular example 1, wherein the nominal voltage is a ground voltage in a write 0 operation.

Example 4 is an apparatus according to any example herein, in particular example 1, wherein the one or more circuitries is to adjust the voltage by an amount substantially equal to a threshold voltage of the transistor.

Example 5 is an apparatus according to any example herein, in particular example 1, wherein the nominal voltage is a ground voltage, and wherein the one or more circuitries is to decrease the voltage on the plate-line below the ground voltage in a write 1 logic operation.

Example 6 is an apparatus according to any example herein, in particular example 1, wherein the nominal voltage is a supply voltage, and wherein the one or more circuitries is to increase the voltage on the plate-line above the supply voltage in a write 0 logic operation.

Example 7 is an apparatus according to any example herein, in particular example 1, wherein the transistor has a gate terminal coupled to a word-line, wherein the one or more circuitries is to increase a voltage on the word-line in the write operation or the read operation.

Example 8 is an apparatus according to any example herein, in particular example 1, wherein the transistor is coupled to a bit-line, wherein the bit-line is parallel to the plate-line, or wherein the plate-line is parallel to a word-line, wherein the word-line is coupled to the transistor.

Example 9 is an apparatus according to any example herein, in particular example 1, wherein the one or more circuitries include: a driver having an output coupled to the plate-line; a pull-up transistor coupled to a supply rail of the driver, and also coupled to a second supply rail; and a pull-down transistor coupled to a ground rail of the driver, and also coupled to a second ground rail.

Example 10 is an apparatus according to any example herein, in particular example 1, wherein the one or more circuitries further include: a fly-capacitor; a first pass-gate coupled to the supply rail and a first terminal of the fly-capacitor; a second pass-gate coupled to the ground rail and the first terminal of the fly-capacitor; and a second driver coupled to a second terminal of the fly-capacitor.

Example 11 is an apparatus according to any example herein, in particular example 10, wherein the output is coupled to a plurality of plate-lines including the plate-line.

Example 12 is an apparatus according to any example herein, in particular example 1, wherein the non-linear polar material is one of a ferroelectric, a paraelectric, or a non-linear dielectric material.

Example 13 is an apparatus according to any example herein, in particular example 1, wherein the non-linear polar material is doped with one or more elements of a 3d, 4d, 5d, 6d, 4f, and 5f series of a periodic table.

Example 14 is an apparatus according to any example herein, in particular example 1, wherein the non-linear polar material includes one of: a perovskite material which includes one of: $BaTiO_3$, $PbTiO_3$, $KNbO_3$, or $NaTaO_3$; bismuth ferrite (BFO); barium titanate (BTO); BFO doped with one of: Sc, Ti, V, Cr, Mn, Fe, Co, Ni, Cu, or Zn; BTO doped with one of: Sc, Ti, V, Cr, Mn, Fe, Co, Ni, Cu, or Zn; LBFO doped with Mn; lead zirconium titanate (PZT) or PZT with a second doping material, wherein the second doping material is one of La, Nb, Mn, or 5d series elements; bismuth ferrite (BFO) with a first doping material, wherein the first doping material is one of lanthanum, elements from lanthanide series of a periodic table, or elements of a 3d, 4d, 5d, 6d, 4f and 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides such as $Hf(1-x)ExOy$, where E can be Al, Ca, Ce, Dy, Er, Gd, Ge, La, Sc, Si, Sr, Sn, Zr, or Y; $Al(1-x)Sc(x)N$, $Ga(1-x)Sc(x)N$, $Al(1-x)Y(x)N$ or $Al(1-x-y)Mg(x)Nb(y)N$, Ey doped $HfO_2$, where x includes one of: Al, Ca, Ce, Dy, Er, Gd, Ge, La, Sc, Si, Sr, Sn, or Y, wherein 'x' or 'y' is a fraction; or niobate type compounds $LiNbO_3$, $LiTaO_3$, lithium iron tantalum oxyfluoride, barium strontium niobate, sodium barium niobate, or potassium strontium niobate; an improper ferroelectric material which includes one of: [PTO/STO]n or [LAO/STO]n, wherein 'n' is between 1 and 100, or a paraelectric material that comprises $SrTiO_3$, $Ba(x)Sr(y)TiO_3$, $HfZrO_2$, Hf—Si—O, La-substituted $PbTiO_3$, a PMN-PT based relaxor ferroelectric; or a paraelectric material that comprises $SrTiO_3$, $Ba(x)Sr(y)TiO_3$, $HfZrO_2$, Hf—Si—O, or a PMN-PT based relaxor ferroelectric.

Example 15 is an apparatus comprising: one or more circuitries to adjust voltage on a plate-line of a bit-cell to be above or below a nominal voltage of the plate-line based at least in part on a write operation, writeback operation, or read operation on the bit-cell.

Example 16 is an apparatus according to any example herein, in particular example 15, wherein the nominal voltage is a ground voltage, and wherein the one or more circuitries is to decrease the voltage on the plate-line below the ground voltage in a write 1 logic operation.

Example 17 is an apparatus according to any example herein, in particular example 15, wherein the nominal voltage is a supply voltage, and wherein the one or more circuitries is to increase the voltage on the plate-line above the supply voltage in a write 0 logic operation.

Example 18 is an apparatus according to any example herein, in particular example 15, wherein the one or more circuitries is to increase a voltage on a word-line of the bit-cell in the write operation or the read operation.

Example 19 is a system comprising: a processor circuitry; a memory coupled to the processor circuitry; and a communication interface to allow the processor circuitry to communicate with another device, wherein the memory includes: one or more circuitries to adjust a voltage on a plate-line to be above or below a nominal voltage of the plate-line based on a write operation or read operation on a bit-cell, wherein the bit-cell comprises: a transistor; and a capacitor including non-linear polar material, wherein the capacitor has a first terminal coupled to the plate-line and a second terminal coupled to the transistor.

Example 20 is a system according to any of examples herein, in particular example 19, wherein the nominal voltage is a ground voltage, and wherein the one or more circuitries is to decrease the voltage on the plate-line below the ground voltage in a write 1 logic operation.

An abstract is provided that will allow readers to ascertain the nature and gist of technical disclosure. Abstract is submitted with an understanding that it will not be used to limit scope or meaning of claims. Following claims are hereby incorporated into detailed description, with each claim standing on its own as a separate embodiment.

We claim:

1. An apparatus comprising:
one or more circuitries to adjust a voltage on a plate-line to be above or below a nominal supply voltage of the plate-line based on a write operation or read operation on a bit-cell, wherein the one or more circuitries include:
a fly-capacitor;
a first pass-gate coupled to a supply rail and a first terminal of the fly-capacitor;
a second pass-gate coupled to a ground rail and the first terminal of the fly-capacitor; and
a second driver coupled to a second terminal of the fly-capacitor, wherein the bit-cell comprises:
a transistor; and
a capacitor which includes non-linear polar material, wherein the capacitor has a first terminal coupled to the plate-line and a second terminal coupled to the transistor.

2. The apparatus of claim 1, wherein the nominal supply voltage is a supply voltage in a write 1 operation.

3. The apparatus of claim 1, wherein the nominal supply voltage is a ground voltage in a write 0 operation.

4. The apparatus of claim 1, wherein the one or more circuitries is to adjust the voltage by an amount substantially equal to a threshold voltage of the transistor.

5. The apparatus of claim 1, wherein the nominal supply voltage is a ground voltage, and wherein the one or more circuitries is to decrease the voltage on the plate-line below the ground voltage in a write 1 logic operation.

6. The apparatus of claim 1, wherein the nominal supply voltage is a supply voltage, and wherein the one or more circuitries is to increase the voltage on the plate-line above the supply voltage in a write 0 logic operation.

7. The apparatus of claim 1, wherein the transistor has a gate terminal coupled to a word-line, and wherein the one or more circuitries is to increase a voltage on the word-line in the write operation or the read operation.

8. The apparatus of claim 1, wherein the transistor is coupled to a bit-line, wherein the bit-line is parallel to the plate-line, or wherein the plate-line is parallel to a word-line, and wherein the word-line is coupled to the transistor.

9. The apparatus of claim 1, wherein the one or more circuitries include:
a driver having an output coupled to the plate-line;
a pull-up transistor coupled to the supply rail of the driver, and also coupled to a second supply rail; and
a pull-down transistor coupled to the ground rail of the driver, and also coupled to a second ground rail.

10. The apparatus of claim 1, wherein a output is coupled to a plurality of plate-lines including the plate-line.

11. The apparatus of claim 1, wherein the non-linear polar material is one of a ferroelectric, a paraelectric, or a non-linear dielectric material.

12. The apparatus of claim 1, wherein the non-linear polar material is doped with one or more elements of a 3d, 4d, 5d, 6d, 4f, and 5f series of a periodic table.

13. The apparatus of claim 1, wherein the non-linear polar material includes one of:
a perovskite material which includes one of: $BaTiO_3$, $PbTiO_3$, $KNbO_3$, or $NaTaO_3$;
bismuth ferrite (BFO);
barium titanate (BTO);
BFO doped with one of: Sc, Ti, V, Cr, Mn, Fe, Co, Ni, Cu, or Zn;
BTO doped with one of: Sc, Ti, V, Cr, Mn, Fe, Co, Ni, Cu, or Zn;
LBFO doped with Mn;
lead zirconium titanate (PZT) or PZT with a first doping material, wherein the first doping material is one of La, Nb, Mn, or 5d series elements;
bismuth ferrite (BFO) with a second doping material, wherein the second doping material is one of lanthanum, elements from lanthanide series of a periodic table, or elements of a 3d, 4d, 5d, 6d, 4f, and 5f series of the periodic table;
a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
a hexagonal ferroelectric which includes one of: $YMnO_3$ or $LuFeO_3$;
hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;
hafnium oxides such as $Hf_{(1-x)}E_xO_y$, where E includes one of Al, Ca, Ce, Dy, Er, Gd, Ge, La, Sc, Si, Sr, Sn, Zr, or Y;
$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$;
y doped $HfO_2$, where y includes one of: Al, Ca, Ce, Dy, Er, Gd, Ge, La, Sc, Si, Sr, Sn, or Y; or
niobate type compounds $LiNbO_3$, $LiTaO_3$, lithium iron tantalum oxyfluoride, barium strontium niobate, sodium barium niobate, or potassium strontium niobate;
an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}$ $TiO_3$, $HfZrO_2$, Hf—Si—O, La-substituted $PbTiO_3$, or a PMN-PT based relaxor ferroelectric; or a paraelectric material that comprises $SrTiO_3$, $Ba_{(x)}Sr_{(y)}$ $TiO_3$, $HfZrO_2$, Hf—Si—O, or a PMN-PT based relaxor ferroelectric.

14. An apparatus comprising:

one or more circuitries to adjust voltage on a plate-line of a bit-cell to be above or below a nominal supply voltage of the plate-line based at least in part on a write operation, writeback operation, or read operation on the bit-cell, wherein the one or more circuitries include:

a fly-capacitor;

a first pass-gate coupled to a supply rail and a first terminal of the fly-capacitor;

a second pass-gate coupled to a ground rail and the first terminal of the fly-capacitor; and a second driver coupled to a second terminal of the fly-capacitor.

15. The apparatus of claim 14, wherein the nominal supply voltage is a ground voltage, and wherein the one or more circuitries is to decrease the voltage on the plate-line below the ground voltage in a write 1 logic operation.

16. The apparatus of claim 14, wherein the nominal supply voltage is a supply voltage, and wherein the one or more circuitries is to increase the voltage on the plate-line above the supply voltage in a write 0 logic operation.

17. The apparatus of claim 14, wherein the one or more circuitries is to increase a voltage on a word-line in of the bit-cell in the write operation or the read operation.

18. A system comprising:

a processor circuitry;

a memory coupled to the processor circuitry; and a communication interface to allow the processor circuitry to communicate with another device, wherein the memory includes:

one or more circuitries to adjust a voltage on a plate-line to be above or below a nominal supply voltage of the plate-line based on a write operation or read operation on a bit-cell, wherein the one or more circuitries include:

a fly-capacitor;

a first pass-gate coupled to a supply rail and a first terminal of the fly-capacitor;

a second pass-gate coupled to a ground rail and the first terminal of the fly-capacitor; and a second driver coupled to a second terminal of the fly-capacitor, wherein the bit-cell comprises:

a transistor; and a capacitor which includes non-linear polar material, wherein the capacitor has a first terminal coupled to the plate-line and a second terminal coupled to the transistor.

19. The system of claim 18, wherein the nominal supply voltage is a ground voltage, and wherein the one or more circuitries is to decrease the voltage on the plate-line below the ground voltage in a write 1 logic operation.

* * * * *